United States Patent
Yamamoto

(10) Patent No.: US 6,466,107 B2
(45) Date of Patent: Oct. 15, 2002

(54) LADDER FILTER COMPRISING STACKED PIEZOELECTRIC RESONATORS

(75) Inventor: Takashi Yamamoto, Ishikawa-ken (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

(21) Appl. No.: 09/734,063

(22) Filed: Dec. 11, 2000

(65) Prior Publication Data

US 2001/0011934 A1 Aug. 9, 2001

(30) Foreign Application Priority Data

Dec. 14, 1999 (JP) .......................... 11-354842
Dec. 14, 1999 (JP) .......................... 11-354854

(51) Int. Cl.⁷ .......................... H03H 9/205; H03H 9/10
(52) U.S. Cl. .......................... 333/189; 310/348
(58) Field of Search .......................... 333/189, 188, 333/187, 186, 191; 310/348, 365, 366, 367, 368

(56) References Cited

U.S. PATENT DOCUMENTS 5,608,362 A * 3/1997 Nishimura et al. ......... 333/191
5,801,603 A * 9/1998 Yamamoto et al. ......... 333/189
5,872,493 A * 2/1999 Ella .......................... 333/191
5,874,869 A * 2/1999 Ueda et al. ................. 333/193

FOREIGN PATENT DOCUMENTS

JP         9-18286      * 1/1997 ............ H03H/9/58

* cited by examiner

Primary Examiner—Robert Pascal
Assistant Examiner—Dean Takaoka
(74) Attorney, Agent, or Firm—Keating & Bennett, LLP

(57) ABSTRACT

A very small size ladder filter has various numbers defining different stages. The ladder filter includes units each defined by stacking a top surface surface-electrode of a bending resonator defining a serial resonator and the bottom surface surface-electrode of a bending resonator defining a parallel resonator with a metallic terminal plate sandwiched therebetween. Two of these units are two-dimensionally arranged on a substrate, and a metallic lid is put on the substrate so as to cover the units. The bottom surface surface-electrode of the serial resonator in a first-stage unit is connected to an input terminal, then the metallic terminal plate in the first stage unit is connected to the bottom surface surface-electrode of the serial resonator in the next-stage unit, and the metallic terminal plate in the next-stage unit is connected to an output terminal. The top-surface surface electrodes of the parallel resonators of all of the units are made conductive to one another by the lid.

19 Claims, 16 Drawing Sheets

LADDER FILTER COMPRISING STACKED PIEZOELECTRIC RESONATORS

BACKGROUND OF THE INVENTION

1. Field of the Invention

The present invention relates to a ladder filter including ladder-connected serial resonators and parallel resonators.

2. Description of the Related Art

A two-stage ladder filter used for communication equipment is shown in FIG. 1. In this ladder filter, two serial resonators 3 and 4 are connected in series between an input terminal 1 and an output terminal 2. A parallel resonator 5 is connected between the midpoint of the serial resonators 3 and 4 and a ground, and a parallel resonator 6 is connected between the output terminal 2 and the ground.

FIG. 2A is a vertical sectional view showing the specific construction of a conventional ladder filter, and FIG. 2B is a horizontal sectional view thereof. This ladder filter 11 includes an input terminal plate 12, a ground terminal plate 16, an output terminal plate 18, an internal connection terminal plate 14 which is bent into a U-shape, piezoelectric resonators 13 and 19 for defining serial resonators 3 and 4 utilizing extensional vibration (hereinafter referred to as "extensional resonator"), and piezoelectric resonators 15 and 17 for defining parallel resonators 5 and 6 utilizing extensional vibration (extensional resonators). The input terminal plate 12, the ground terminal plate 16, and the output terminal plate 18 have lead feet 12a, 16a, and 18a, respectively. The extensional resonators 13, 15, 17, and 19 each perform extensional vibrations wherein the expansion toward the outer periphery direction and the contraction toward the center direction are repeated by the application of an electrical signal. Nodes are located at the centers of the main surfaces of each of these extensional resonators 13, 15, 17, and 19.

As shown in FIGS. 2A and 2B, this ladder filter is defined by stacking the above-described components in the order of the input terminal plate 12, the extensional resonator 13, one electrode 14a of the internal connection terminal plate 14, the extensional resonator 15, the ground terminal plate 16, the extensional resonator 17, the output terminal plate 18, the extensional resonator 19, the other electrode 14b of the internal connection terminal plate 14. Herein, protrusions provided on the input terminal plate 12, the ground terminal plate 16, the output terminal plate 18, and the electrode plates 14a and 14b of the internal connection terminal plate 14 are each abutted against the central portions which are the nodes of the extensional resonators 13, 15, 17, and 19. The lead feet 12a, 16a, and 18a of the respective input terminal plate 12, the ground terminal plate 16, the output terminal plate 18 are each inserted into holes of a bottom lid 21. The holes are filled with a resin 22, and sealed by providing a cover 20 thereon.

Such a ladder filter, however, not only has a complicated structure and is difficult to assemble, but also must be redesigned each time the number of stages thereof is increased. This redesign process is both time consuming and costly. For example, since the two-stage ladder filter and the three-stage ladder filter have very different terminal structures (particularly, in the structure of the internal connection terminal), it is impossible to design a three-stage or four-stage ladder filter on the basis of the structure of a two-stage ladder filter, and there is a need for redesigning whenever the number of stages is changed.

FIG. 3A shows the construction of an extensional resonator used as a serial resonator or a parallel resonator in the ladder filter as described above. FIG. 3B shows the directions of the polarization axis and the electric-field axis thereof. This extensional resonator 7 is provided with surface electrodes 9 on the main surfaces of a single-layered piezoelectric layer 8 having a square shape, and the entire piezoelectric layer 8 is polarized in a direction that is perpendicular to both main surfaces. Since the direction of an electric field applied across the surface electrodes 9 (the electric-field axis) is also perpendicular to both main surfaces, the electric-field axis is parallel with the polarization axis. In such an extensional resonator 7, once a signal is applied between the surface electrodes 9, the piezoelectric layer 8 expands and contracts with respect to the outer periphery direction, in the planes parallel with both main surfaces.

In the extensional resonator 7, the product of the length Ls of one side thereof and resonance frequency fr is substantially constant as expressed by:

$$Ls \times fr = As \tag{1}$$

where, As is a constant (frequency constant), and approximately equal to 2100 mmkHz. For example, when trying to obtain a resonator having a resonance frequency fr=450 kHz, the length of one side thereof will be Ls=4.67 mm.

However, since there is an increasing need to miniaturize electronic components, it is difficult for such an extensional resonator to meet the needs for reductions in the size and weight, and further for cost reduction. That is, the dimensions as described above cannot be substantially reduced and maintain the desired resonance frequency.

FIG. 4 shows attenuation characteristics of the ladder filter having a two-stage configuration. As characteristics of such a ladder filter, the guaranteed attenuation value Att. shown in FIG. 4 must be as large as possible. Denoting the inter-terminal capacities of the serial resonators 3 and 4 as C1 and C1, respectively, and the inter-terminal capacities of the parallel resonators 5 and 6 as C2 and C2, respectively, the guaranteed attenuation value Att. of the ladder filter of a two-stage configuration is expressed by:

$$Att. = 2 \times 20 \log (C2/C1) \tag{2}$$

To increase the guaranteed attenuation value, therefore, it is necessary to increase the inter-terminal capacities C2 and C2 of the respective parallel resonators 5 and 6, and to decrease the inter-terminal capacities C1 and C1 of the respective serial resonators 3 and 4. However, when extensional resonators as described above are used as the parallel resonators 5 and 6, it has been difficult to increase the inter-terminal capacity C2, for the reasons described hereinafter.

Denoting the length of one side of the extensional resonator 7 shown in FIG. 3A as Ls, the dielectric constant of the piezoelectric layer 8 as $\epsilon$, and the thickness thereof as t, the inter-terminal capacity Cs thereof is expressed by the following equation:

$$Cs = (\epsilon \times \epsilon_0 \times Ls^2)/t \tag{3}$$

where, $\epsilon_0$ is a permittivity in a vacuum, and $\epsilon_0 = 8.854 \times 10^{-12}$.

Since the length of one side of the extensional resonator 7 is determined if the resonance frequency fr of the extensional resonator 7 is determined (see the equation (1)), the inter-terminal capacity is determined only by the thickness t and the dielectric constant $\epsilon$ of the piezoelectric layer 8.

To increase the inter-terminal capacity Cs of the extensional resonator 7, it is necessary to increase the dielectric constant $\epsilon$ of the piezoelectric layer 8, or reduce the thickness t thereof. However, the dielectric constant $\epsilon$ of the piezoelectric layer 8 is a constant inherent in the material of the piezoelectric layer 8, and cannot be optionally selected. If the piezoelectric material is changed to increase the dielectric constant $\epsilon$, other characteristics are affected. On the other hand, if the thickness t of the piezoelectric layer 8 is reduced, the strength thereof will decrease, and the extensional resonator 7 becomes more susceptible to failure, so that the range of selection of the thickness t is substantially limited.

Therefore, although a resonator having a large inter-terminal capacity has been required as a parallel resonator for a ladder filter, it has been difficult to obtain a resonator having a large inter-terminal capacity. Furthermore, even if a piezoelectric resonator having a small constant corresponding to the above-described constant Cs is developed, and the miniaturization of the piezoelectric resonator is effected, the inter-terminal capacity will substantially decrease, and hence the guaranteed attenuation of a ladder filter will deteriorate when the piezoelectric resonator is used as a parallel resonator.

For a resonator operating in 300 kHz to 800 kHz band, extensional vibrations of a ceramic piezoelectric body have been utilized. FIG. 13A is a perspective view illustrating the construction of a piezoelectric resonator 101 utilizing extensional vibration (extensional resonator), and FIG. 13B is a side view illustrating the directions of the polarization axis and the electric-field axis thereof. This extensional resonator 101 is provided with surface electrodes 103 on both main surfaces of a single-layered piezoelectric layer 102 having a square shape, and the entire piezoelectric layer 102 is polarized in the direction perpendicular to both main surfaces. Since the direction of an electric field applied across the surface electrodes 103 (electric-field axis) is also perpendicular to both main surfaces, the electric-field axis is parallel with the polarization axis. In such an extensional resonator 101, when a signal is applied between the surface electrodes 103, the piezoelectric layer 102 expands and contracts with respect to the outer periphery direction, in the planes parallel with both main surfaces.

In the extensional resonator 101, the product of the length Ls of one side thereof and resonance frequency fr is substantially constant as expressed by:

$$Ls \times fr = As$$

where, As is a constant (frequency constant), and substantially equal to 2100 mmkHz. For example, when trying to obtain the resonator of which the resonance frequency is fr=450 kHz, the length of one side will be Ls=4.67 mm.

However, since there is an increasing need to miniaturize electronic components, it is difficult for such an extensional resonator to meet the needs for reductions in the size and weight, and further for cost reduction. That is, the dimensions as described above cannot be substantially reduced and maintain the desired resonance frequency.

FIG. 14 shows a two-stage ladder filter 106 including serial resonators 107a and 107b, and parallel resonators 108a and 108b, and FIG. 15 shows attenuation characteristics thereof. As characteristics of this ladder filter 106, the guaranteed attenuation value Att. shown in FIG. 15 must be as large as possible. Designating the inter-terminal capacities of the serial resonators 107a and 107b as C1 and C1 respectively, and the inter-terminal capacities of the parallel resonators 108a and 108b as C2 and C2, respectively, the guaranteed attenuation values Att. of a ladder filter 106 of two-stage configuration is expressed by:

$$Att. = 2 \times 20 \log (C2/C1)$$

In order to increase the guaranteed attenuation value, therefore, it is necessary to increase the inter-terminal capacities C2 and C2 of the respective parallel resonators 108a and 108b, and to decrease the inter-terminal capacities C1 and C1 of the respective serial resonators 107a and 107b. However, when extensional resonators 101 as described above are used as parallel resonators 108a and 108b, it has been difficult to increase the inter-terminal capacity C2, for the reason described hereinafter.

Denoting the length of one side of the extensional resonator 1 shown in FIG. 13A as Ls, the dielectric constant of the piezoelectric layer 102 as $\epsilon$, and the thickness thereof as t, the inter-terminal capacity Cs is expressed by the following equation:

$$Cs = (\epsilon \times \epsilon_0 \times Ls^2)/t$$

where, $\epsilon_0$ is a permittivity in a vacuum, and $\epsilon_0 = 8.854 \times 10^{-12}$.

Since the length of one side of the extensional resonator 101 is determined if the resonance frequency fr of the extensional resonator 101 is determined (see the equation (1)), the inter-terminal capacity can be changed only by the thickness t and the dielectric constant $\epsilon$ of the piezoelectric layer 102.

To increase the inter-terminal capacity Cs of the extensional resonator 101, it is necessary to increase the dielectric constant $\epsilon$ of the piezoelectric layer 102, or reduce the thickness t thereof. However, the dielectric constant $\epsilon$ of the piezoelectric layer 102 is a constant inherent in the material of the piezoelectric layer 102, and cannot be optionally selected. If the piezoelectric material is changed to increase the dielectric constant $\epsilon$, other characteristics will be affected. On the other hand, if the thickness t of the piezoelectric layer 102 is reduced, the breaking thereof is substantially decreased, and the extensional resonator 101 becomes susceptible to failure, so that the range of selection of the thickness t is substantially limited.

Therefore, although a resonator having a large inter-terminal capacity is required as a parallel resonator of a ladder filter, it has been difficult to obtain a resonator having a large inter-terminal capacity. Furthermore, even if a piezoelectric resonator having a small constant corresponding to the above-described constant Cs is developed, and the miniaturization of the piezoelectric resonator is effected, the inter-terminal capacity substantially decreases, and hence the guaranteed attenuation of a ladder filter deteriorates when the piezoelectric resonator is used as a parallel resonator.

SUMMARY OF THE INVENTION

To overcome the above-described problems, preferred embodiments of the present invention provide a low profile and small-sized ladder filter. Another preferred embodiment of the present invention provides a ladder filter having a large guaranteed attenuation value and having superior characteristics.

In accordance with a first preferred embodiment of the present invention, a ladder filter is provided which includes a substrate, conductive members, plural sets of units each of which is defined by stacking a serial resonator utilizing bending vibration and a parallel resistor utilizing bending vibration with the conductive member sandwiched between one side surface electrode of the serial resonator and one side surface electrode of the parallel resonator, conductive patterns provided on the substrate, and a conductive lid for covering the units. In this ladder filter, the plural sets of units are two-dimensionally arranged on the substrate, the lid is arranged on the substrate so as to cover the units, the other side surface electrode of the serial resonator in each of the units at a second stage and at stages thereafter is conductive to the conductive member at the preceding stage by the conductive patterns and the lid, and the other side surface electrodes of the parallel resonators of all of the units are conductive to one another.

It is preferable that the above-described serial resonator and the above-described parallel resonator each have a different number of internal electrodes, with the resonator having the greater number of internal electrodes defining a parallel resonator, while the resonator having fewer internal electrodes defining a serial resonator.

Preferably, the other side surface electrodes of the parallel resonators of all of the units are conductive to one another via the lid of which substantially the entire surface is electrically conductive.

In the ladder filter in accordance with the first preferred embodiment of the present invention, since a plurality of units including the stacked serial and parallel resonators with the conductive member sandwiched therebetween, are two-dimensionally arranged on the substrate, the serial resonators and parallel resistors constituting each of the units are ladder-connected. The increase in the number of the stages of ladder filters is achieved by installing additional units on the substrate, and by making the other side surface electrode of the serial resonator in each of the units (this other side surface electrode is the surface electrode opposite to the surface electrode in contact with the conductive member, and constitutes the signal input side) conductive to the conductive member (signal output side) in the preceding-stage unit, as well as by making the other side surface electrode (ground side) of the parallel resonator in one of the units conductive to the other side surface electrode of the parallel resonator in another unit. Therefore, the wiring pattern is achieved by repeating a fixed pattern, which facilitates redesign when increasing the number of stages of a ladder filter. In particular, the use of the conductive members is shared even if the numbers of the stages of ladder filters are different.

Since the serial resonators and the parallel resonators in this ladder filter utilize area bending vibration, the dimensions thereof can be greatly decreased as compared to that of an extensional resonator. Also, since all of the units in the ladder filter are connected to one another by the wiring patterns provided on the substrate and the lid, the need for wiring spaces for interconnecting the units by bonding wire or leads is eliminated. This permits a very low profile and small-sized ladder filter to be produced.

Furthermore, in the ladder filter in accordance with the first preferred embodiment of the present invention, since, out of the resonators utilizing area bending vibration, a resonator including more internal electrodes is used as a parallel resonator, while the resonator including fewer internal electrodes is used as a serial resonator, the inter-terminal capacity of the parallel resonator is substantially greater than that of the serial resonator without substantially enlarging or substantially thinning the parallel resonator. This results in an increased guaranteed attenuation value and improved filter characteristics.

Moreover, in the ladder filter in accordance with the first preferred embodiment of the present invention, since the other side surface electrodes of the parallel resonators of all of the units are made conductive with respect to one another through the lid, there is no need to provide the substrate with conductive patterns for making the other side surface electrodes of the parallel resonators conductive to one another, and thereby the conductive patterns are greatly simplified. Even when reducing the size of the ladder filter, therefore, the line width of a pattern can be enlarged to reduce wiring resistance. In addition, since substantially the entire surface of the lid has an electrical conductivity, and is conductive to the other side surface electrodes of the parallel resonators, the other side surface electrodes having ground potentials, the lid has an electromagnetic shielding effect. This produces a ladder filter having a high noise immunity.

In accordance with a second preferred of the present invention, a ladder filter is provided which includes a substrate, a plurality of piezoelectric resonators utilizing area bending vibration, a lid for covering the piezoelectric resonators, conductive patterns provided on the substrate, and conductive members provided on the lid. In this ladder filter, the plurality of the piezoelectric resonators are two-dimensionally arranged on the substrate, the lid is mounted on the substrate to cover the piezoelectric resonators, and the plurality of the piezoelectric resonators are ladder-connected by the conductive patterns and the conductive members.

It is preferable that, by placing the nodes or the vicinities thereof of the piezoelectric resonators on the conductive protrusions disposed on the top surface of the substrate, the piezoelectric resonators is supported in a state isolated from the substrate, as well as the conductive patterns and the electrodes of the piezoelectric resonators be made conductive to one another via the conductive protrusions, and that, by abutting the conductive protrusions disposed on the bottom surface of the lid against the nodes or the vicinities thereof of the piezoelectric resonators, the lid being isolated from the piezoelectric resonators, as well as the conductive members and the electrodes of the piezoelectric resonators be made conductive to one another via the conductive protrusions.

It is preferable that the plurality of the above-described piezoelectric resonators utilizing area bending vibration be defined by resonators having a different number of internal electrodes and the resonator having the greater number of internal electrodes defines a parallel resonator, while the resonator having fewer internal electrodes is used as a serial resonator.

Preferably, the lid is formed by insert-molding metallic plates in a resin molded portion.

Preferably, the portions of each of the metallic plates, the portions which are exposed outside of the lid, are in contact with the conductive patterns on the substrate.

In the ladder filter in accordance with the second preferred embodiment of the present invention, since a plurality of piezoelectric resonators are arranged in two dimensions, and the piezoelectric resonators are ladder-connected by the conductive patterns on the substrate and the conductive members provided on the lid, the profile of the ladder filter is greatly reduced. Also, since the piezoelectric resonators utilize bending vibration, the dimensions of each of the resonators is greatly reduced, and a ladder filter having greatly reduced dimensions is achieved. This produces a much less expensive ladder filter.

Furthermore, in the ladder filter in accordance with the second preferred embodiment of the present invention, since the piezoelectric resonators are isolated from the substrate and the lid by sandwiching the nodes or the vicinities thereof of the piezoelectric resonators by the conductive protrusions provided on the substrate and the lid, vibrational spaces are provided over both surfaces of the piezoelectric resonators, and the vibration of the piezoelectric resonators is not substantially damped.

Moreover, in the ladder filter in accordance with the second preferred embodiment of the present invention, since among the piezoelectric resonators utilizing area bending vibration, the piezoelectric resonator including more internal electrodes is used as a parallel resonator while the piezoelectric resonator including less internal electrodes is used as a serial resonator, the inter-terminal capacity of the parallel resonator is larger than that of the serial resonator without the need to substantially enlarge or substantially thin the parallel resonator. This results in a greatly increased guaranteed attenuation value and greatly improved filter characteristics.

In addition, in the ladder filter in accordance with the second preferred embodiment of the present invention, since the lid is formed by insert-molding metallic plates in the resin molded portion thereof, the insulating portions and the conductive portions thereof are each produced easily and at a low cost.

Further, in the ladder filter in accordance with the second preferred embodiment of the present invention, since the portions of each of the metallic plates which are exposed to the outside of the lid are in contact with the conductive patterns of the substrate, it can be easily checked, from outward appearance, whether the metallic plates (conductive portions) of the lid are connected to the conductive patterns on the substrate.

The above and other objects, features and advantages of the present invention will be apparent from the following detailed description of the preferred embodiments of the invention in conjunction with the accompanying drawings.

DETAILED DESCRIPTION OF PREFERRED EMBODIMENTS

Figure 5:
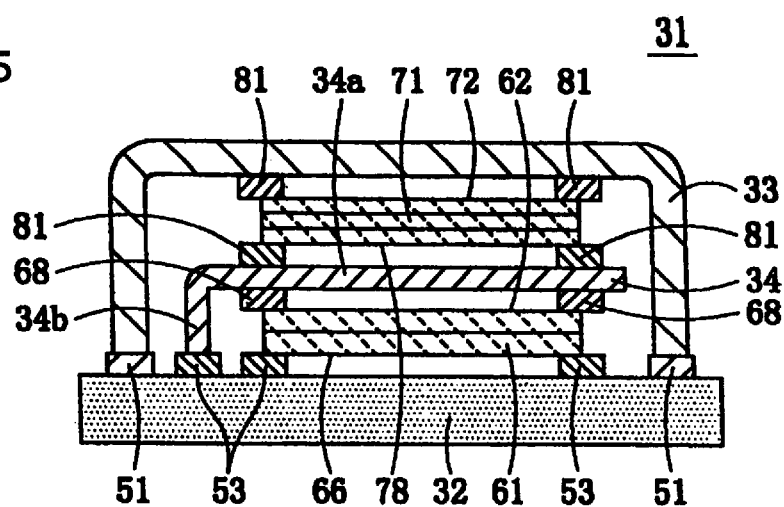
FIG. 5 is a sectional view showing the construction of a ladder filter in accordance with one preferred embodiment of the present invention.
Figure 6:
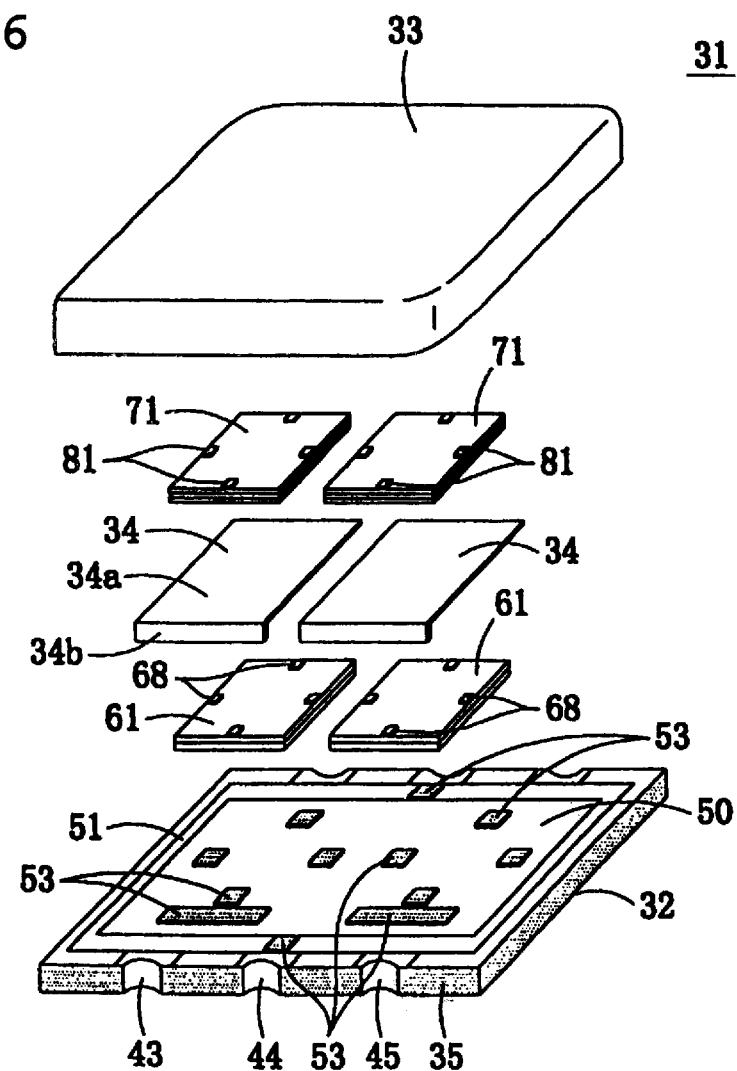
FIG. 6 is an explosive perspective view illustrating the ladder filter shown in FIG. 5.

FIG. 5 is a sectional view showing a ladder filter 31 in accordance with a first preferred embodiment of the present invention. FIG. 6 is an explosive perspective view illustrating the ladder filter 31. The ladder filter 31 preferably has a two-stage configuration, and includes a substrate 32, two sets of units, and a lid 33.

Each of the units is defined by stacking a metallic terminal plate 34 above a piezoelectric resonator 61 utilizing are a bending vibration (hereinafter referred to as "bending resonator") and stacking thereabove a piezoelectric resonator 71 utilizing area bending vibration (bending resonator). On the top surface of the piezoelectric resonator 61, conductive pillows 68 are provided in the vicinity of the nodes of the piezoelectric resonator 61 by applying and drying a conductive paste at the approximate central portion of each of the sides portions of the top surface. The metallic terminal plate 34 is provided above the bending resonator 61 to be in contact with the conductive pillow 68, and a vibrational space is provided between the surface electrode 62 on the top surface of the bending resonator 61 and the metallic terminal plate 34. Likewise, on both of the top surface and bottom surface of the piezoelectric resonator 71, conductive pillows 81 are provided in the vicinity of the nodes of the piezoelectric resonator 71 by applying and drying a conductive paste at the approximate central portion of each of the side portions of the top surface. The bending resonator 71 is provided above the metallic terminal 34 so as to be contacted with the top surface of the conductive terminal plate 34, and a vibrational space is provided between the metallic terminal plate 34 and the surface electrode 78 on the bottom surface of the bending resonator 71. Therefore, the surface electrode 62 on the top surface of the bending resonator 61 and the surface electrode 78 on the bottom surface of the bending resonator 71 are conductive to the metallic terminal plate 34 via the conductive pillows 68 and 81.

In this unit, the upper and lower bending resonators 71 and 61 are τ-type connected and define the first stage of the ladder filter. The bending resonator 61 is used as a serial resonator in the ladder filter 31, and the bending resonator 71 is used as a parallel resonator in the ladder filter 31. The surface electrode 66 on the bottom surface of the bending resonator 61 defines an input end of the ladder circuit, the metallic terminal plate 34 defines an output end of the ladder circuit, and the surface electrode 72 on the top surface of the bending resonator 71 defines a ground end of the τ-type circuit. The metallic terminal plate 34 is bent at the end portion thereof, and the bent portion 34b thereof extends downward from the end portion of a plane portion 34a sandwiched between the bending resonators 61 and 71.

The lid 33 has dimensions to cover the two units, and is made of a metallic material having a good electric conductivity, such as aluminum, or other suitable materials.

Figure 7A:
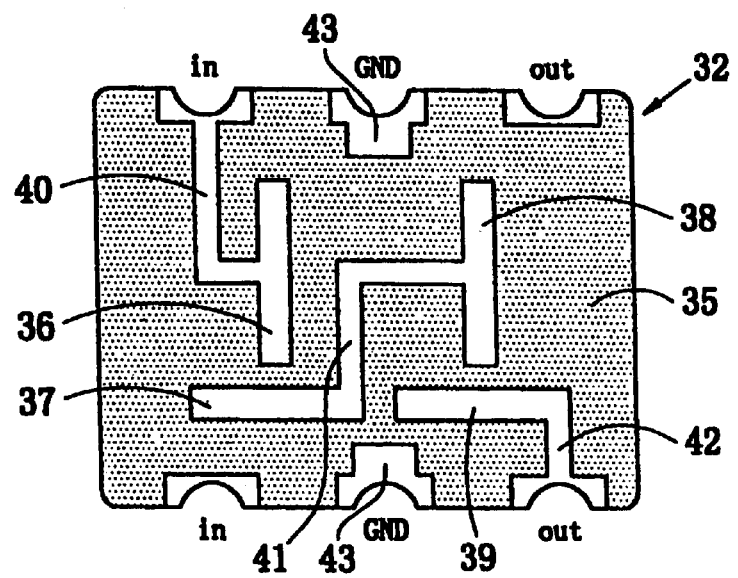
FIGS. 7A, 7B, and 7C are plan, side, and bottom views, respectively, of the substrate used for the ladder filter shown in FIG. 5.
Figure 7B:
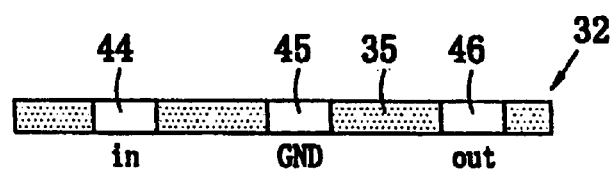
Figure 7C:
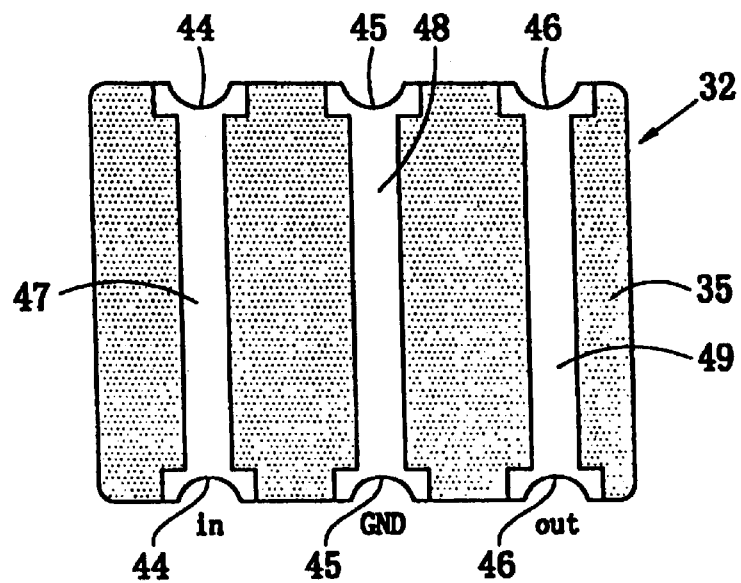

FIGS. 7A, 7B, and 7C are plan, side, and bottom views, respectively, showing the construction of the above-described substrate 32. The substrate 32 is constructed by providing conductive patterns on the top surface, bottom surface, and both side surfaces of a ceramic plate 35. An input terminal 44, a ground terminal 45, and an output terminal 46 are each arranged to extend from both side surfaces of the substrate 32 to the top and bottom surfaces. The input terminals 44 on both side surfaces are interconnected by a connection line 47 on the rear surface, the ground terminals 45 on both side surfaces are interconnected by a connection line 48 on the rear surface, and the output terminals 46 on both side surfaces are interconnected by a connection line 49 on the rear surface.

At positions nearer to the input terminals 44 on the top surface of the substrate 32, a pad portion 36 for placing a first-stage unit and a terminal plate connection pad 37 for connecting the bent portion 34b of the metal terminal plate 34 of the first-stage unit are provided, while at the positions nearer to the output terminals 46 on the top surface of the substrate 32, a pad portion 38 for placing a next-stage unit and a terminal plate connection pad 39 for connecting the bent portion 34b of the metal terminal plate 34 of the next-stage unit are provided. The pad portion 36 on the first stage side is connected to the input terminal 44 by a lead-out line 40, the terminal plate connection pad 37 on the first-stage side and the pad portion 38 on the next-stage side are connected by a connection line 41, and the terminal plate connection pad 39 on the next-stage side is connected to the output terminal 46 by a lead-out line 42. On the top surface of the substrate 32, a lid connection pad 43 extends from both ground terminals 45.

Figure 8:
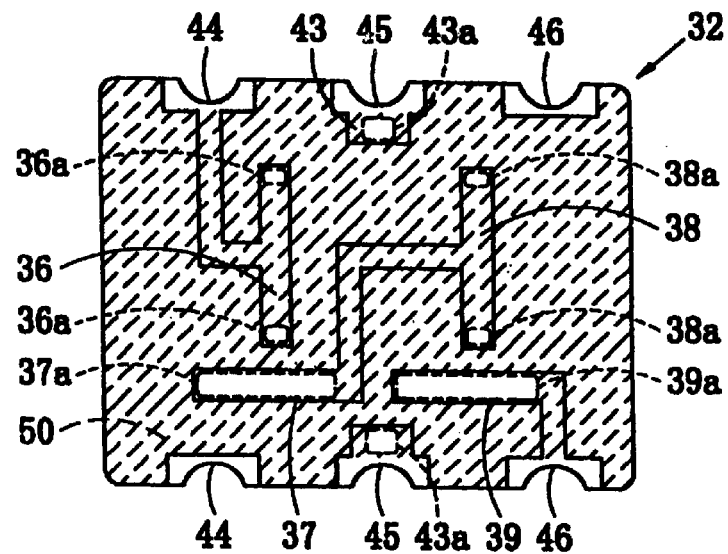
FIG. 8 is a diagram illustrating the application area of a solder resist ink on the substrate shown in FIG. 7.

To mount the units on the substrate 32, a solder resist ink 50 is applied over the area indicated by slanted broken lines in FIG. 8. At this time, both ends of the each of the pad portions 36 and 38, the terminal plate connection pads 37 and 39 except the periphery thereof, and the lid connection pads 43 except the periphery thereof, are arranged to be exposed from the openings 36a, 38a, 37a, 39a, and 43a for the solder resist ink 50, respectively.

Figure 9:
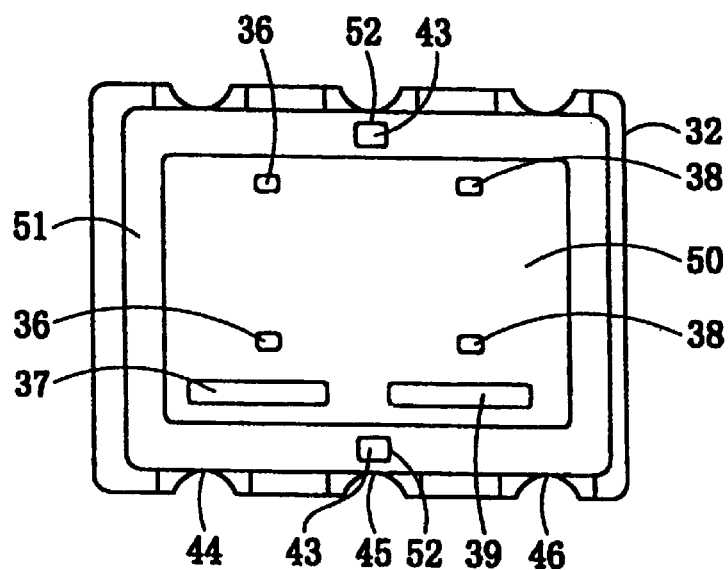
FIG. 9 is a plan view showing the substrate on which a solder resist ink and an insulating adhesive have been applied.

Next, as illustrated in FIG. 9, an insulating adhesive 51 is printed on the periphery of the top surface of the substrate 32. The area where the insulating adhesive 51 is printed has substantially the same dimensions as the bottom surface of the lid 33. When the insulating adhesive 51 is applied, on the lid connection pad 43, the insulating adhesive printed 51 is arranged to be partially opened so that the lid connection pad 43 is exposed from this opening 52.

Figure 10:
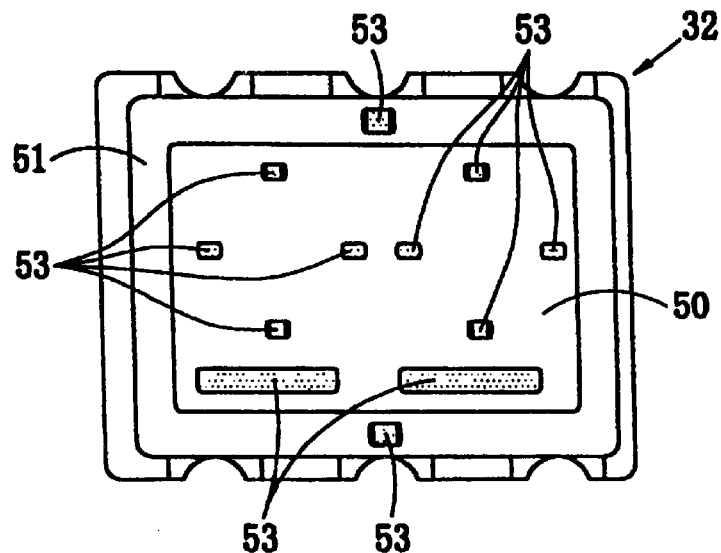
FIG. 10 is a plan view showing the substrate on which conductive pillows are provided.

Then, a conductive paste is applied to the pad portions 36, the terminal plate connection pad 37, the pad portion 38, the terminal plate connection pad 39, and the lid connection pad 43 which are exposed from the solder resist ink 50 and the insulating adhesive 51, and, and thereby these pads are arranged to define conductive pillows 53 after the conductive paste has been set, as illustrated in FIG. 10. Simultaneously, on both sides of each of the pad portions 36 and the pad portions 38, the conductive paste is also applied over the solder resist ink 50 and is arranged to define the conductive pillow 53.

When the substrate 32 has thus been prepared, one of the units is placed on the pad portions 36 and on the conductive pillows 53 on both sides thereof, the nodes of the lower bending resonator 61 are supported by the conductive pillows 53, and a vibrational space is provided between the bottom surface of the bending resonator 61 and the substrate 32. Also, the tip of the bent portion 34b of the metallic terminal plate 34 sandwiched between the bending resonators 61 and 71, is pressure-contacted to the conductive pillow 53 of the terminal plate connection pad 37.

Likewise, the other unit is placed on the pad portions 38 and on the conductive pillows 53 on both sides thereof, the nodes of the lower bending resonator 61 are supported by the conductive pillows 53, and a vibrational space is provided between the bottom surface of the bending resonator 61 and the substrate 32. Also, the tip of the bent portion 34b of the metallic terminal plate 34 sandwiched between the bending resonators 61 and 71, is pressure-contacted to the conductive pillow 53 of the terminal plate connection pad 39.

On completion of the mounting of the two units on the substrate 32 in the above-described manner, the lid 33 is provided on the substrate 32, and the bottom surface of the lid 33 is pressed against the insulating adhesive 51 to adhere the lid 33 to the substrate 32. Simultaneously, the bottom surface of the lid 33 is press-contacted to the conductive pillows 53 in the openings 52, and the lid 33 is made conductive to the ground terminal 45 via the conductive pillows 53 and the lid connection pads 43. Also, the conductive pillows 81 on the top surface of the upper bending resonator 71 of the unit are press-contacted to the inner surface of the lid, and the surface electrode 72 on the top surface of the bending resonator 71 is made conductive to the ground terminal 45 via the lid 33.

Figure 1:
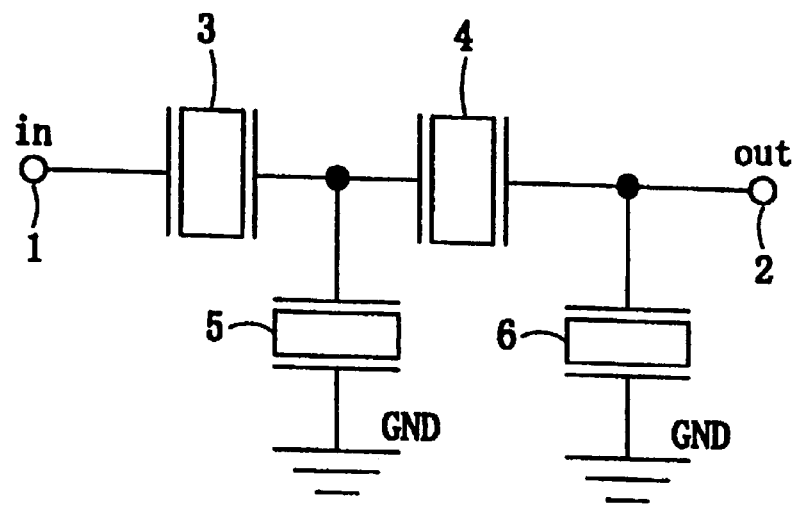
FIG. 1 is a diagram showing the circuit configuration of a ladder filter.
Figure 2A:
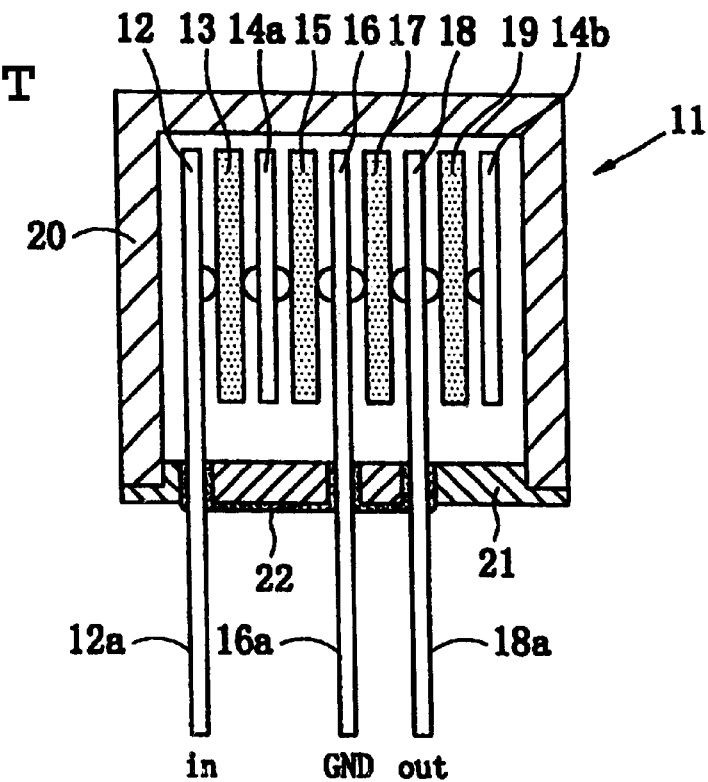
FIG. 2A is a vertical sectional view showing the specific construction of a conventional ladder filter.
Figure 2B:
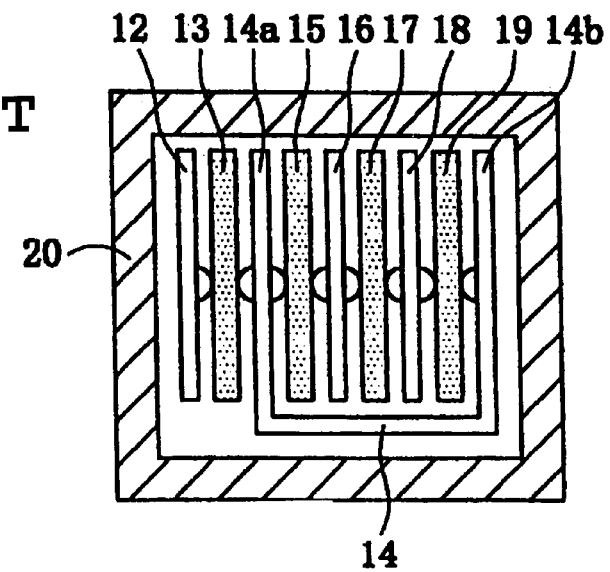
FIG. 2B is a horizontal sectional view thereof.
Figure 3A:
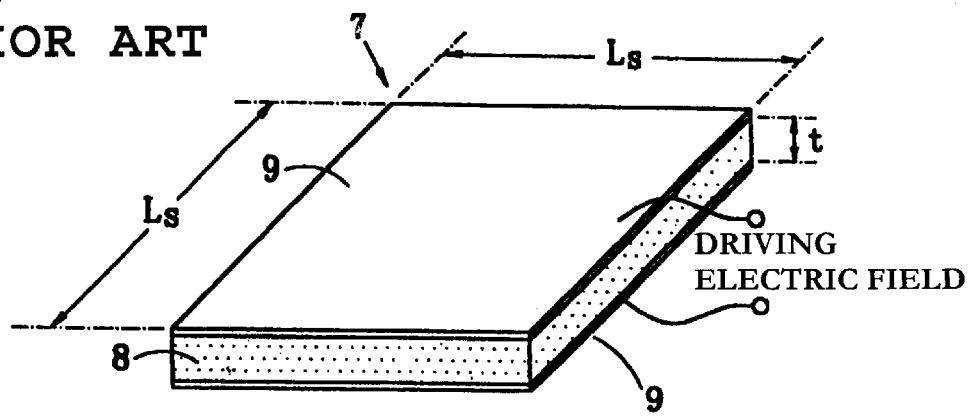
FIG. 3A is a perspective view the construction of a conventional extensional resonator.
Figure 3B:
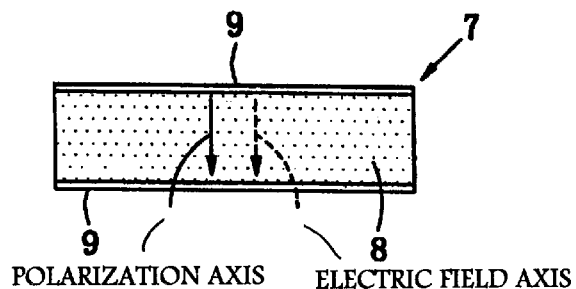
FIG. 3B is a side view showing the directions of the polarization axis and electric-field axis thereof.
Figure 4:
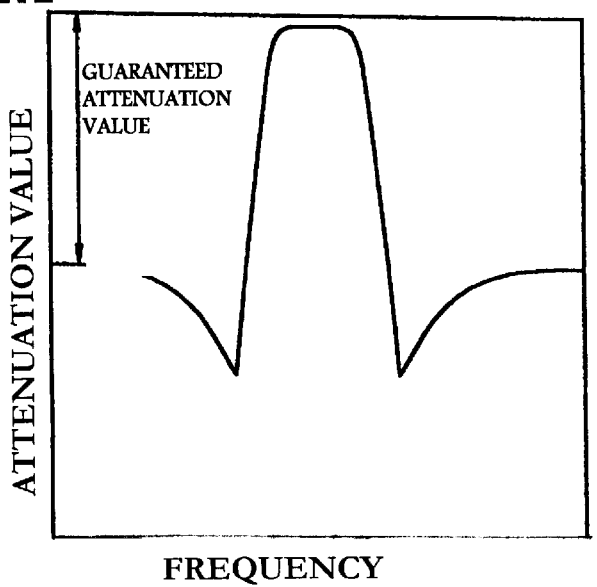
FIG. 4 is a graph illustrating the characteristics of the ladder filter shown in FIG. 1.

As a result, the surface electrode 66 on the bottom surface of the bending resonator 61 in the first-stage unit is connected to the input terminal 44, the surface electrode 72 on the top surface of the bending resonator 71 is connected to the ground terminal 45, and the metallic terminal plate 34 is conductive to the surface electrode 62 on the top surface of the bending resonator 61 and the surface electrode 78 on the bottom surface of the bending resonator 71 is connected to the surface electrode 66 on the bottom surface of the bending resonator 61 in the next-stage unit. Furthermore, the surface electrode 72 on the top surface of the bending resonator 71 in the next-stage unit is connected to the ground terminal 45, and the metallic terminal plate 34 is conductive to the surface electrode 62 on the top surface of the bending resonator 61 and the surface electrode 78 on the bottom surface of the bending resonator 71 is connected to the output terminal 46. Thereby, the ladder filter 31 having a two-stage configuration shown in FIG. 1 is completed.

In accordance with the ladder filter having the structure as described above, when expanding the stage-configuration into, for example, a three-stage configuration or four-stage configuration, the design of a multiple-stage ladder filter wherein the number of the stages is increased to any desired number is greatly facilitated, and requires merely mounting the same units, by providing an additional conductive patterns connected to the precedent stage like the conductive patterns at the next-stage on the substrate 32 shown in FIG. 7.

Figure 11A:
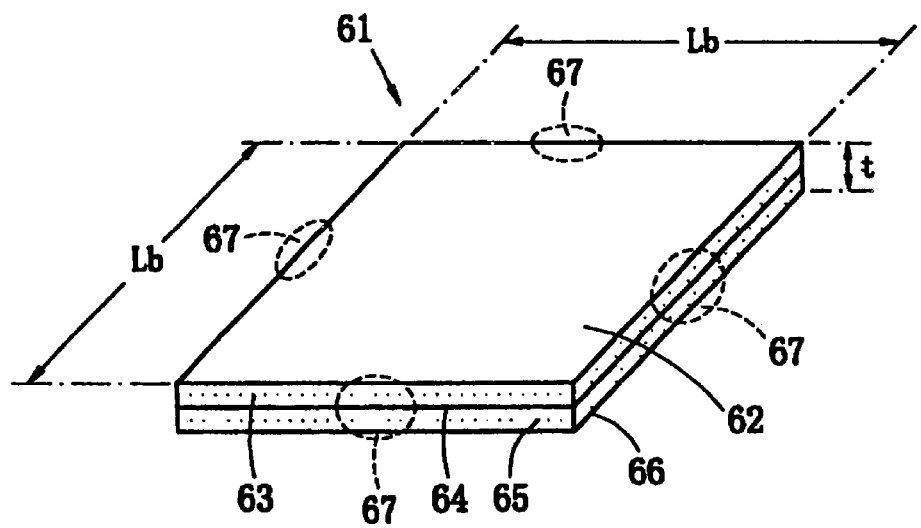
FIG. 11A is a perspective view illustrating the bending vibrator (serial resonator) used in the ladder filter shown in FIG. 5.

Next, the bending resonator 61 used as a serial resonator in the above-described ladder filter will be described. FIG. 11A is a perspective view illustrating this bending resonator 61. The bending resonator 61 is used, for example, in the frequency band of 300 Hz to 800 kHz. The bending resonator 61 is constructed by sandwiching an internal electrode 64 between two ceramic piezoelectric layers 63 and 65 each having a substantially square shape, and providing surface electrodes 62 and 66 on both main surfaces on the front and rear side surfaces of the laminated body, respectively, which includes piezoelectric layers 63 and 65 and an internal electrode 64. The piezoelectric layers 63 and 65 on both sides of the internal electrode 64 have been polarized in the direction that is substantially perpendicular to the main surfaces such that the polarization directions thereof are opposite to each other. As indicated by solid line arrows in FIG. 11B, the polarization direction may be the outward direction with respect to the internal electrode 64, or may be the inward direction with respect to the internal electrode 64.

Figure 11B:
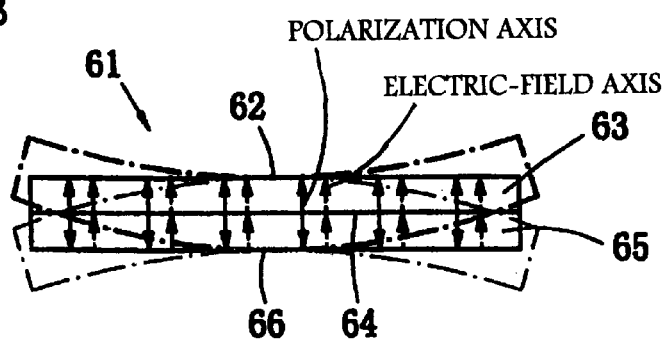
FIG. 11B is a explanatory view illustrating a state of the area bending vibration thereof.

Once a voltage is applied across the surface electrodes 62 and 66, therefore, an electric field is generated in the direction indicated by broken line arrows in FIG. 11B. Within one of the piezoelectric layers, the electric-field direction and the polarization direction is the same, so that the piezoelectric layer contracts toward the center, while, within the other of the piezoelectric layers, the electric-field direction and the polarization direction become opposite to each other, so that the piezoelectric layer expands toward the outer edge direction. As a result, when a signal (a high-frequency electric field) is applied between the surface electrodes 62 and 66, the piezoelectric layers 63 and 65 each operate in a extensional vibration mode, that is, each expand towards the outer edge and contract towards the center. However, the piezoelectric layers 63 and 65 expand and contract in opposite phases to each other, and therefore, as shown in FIG. 11B, the bending resonator 61 is bent and deform so that both main surfaces thereof are alternately convexed and concaved repeatedly (bending vibration), as a whole. The nodes 67 of this bending vibrator are located on the approximate central portions of all of the sides.

In this bending resonator 61, when the element thickness t is constant, the product of the length Lb of one side thereof and the resonance frequency fr is substantially constant as expressed by:

$$Lb \times fr = Ab \tag{4}$$

where the thickness t is 0.2 mm, $$Ab \approx 430 \text{ mmkHz}$$

Since the frequency constant Ab of this bending resonator 61 is approximately 0.2 times the frequency constant As of the extensional resonator, the length Lb of one side of the bending resonator 61 is approximately 0.2 times the length Ls of one side of the extensional resonator, with respect to the same resonance frequency fr. When comparing the bending resonator 61 with the extensional resonator, therefore, the length of one side of the bending resonator 61 is not more than approximately ⅕ times the length of one side of the extensional resonator, and the area of the bending resonator 61 is approximately 1/24 times the area of the extensional resonator. Given the same resonance frequency fr, therefore, the dimensions of the resonator are greatly reduced as compared to the dimensions of the extensional resonator by using a bending resonator 61.

In the bending resonator 61, denoting the length of one side thereof as Lb, the dielectric constant of the piezoelectric layers 63 and 65 as $\epsilon$, and the total thickness of the piezoelectric layers 63 and 65 as t, the inter-terminal capacity thereof Cp is expressed by the following equation (5).

$$Cp = (\epsilon \times \epsilon_0 \times Lb^2)/t \tag{5}$$

where, $\epsilon_0$ is a permittivity in a vacuum. Hence, if the total thickness of the piezoelectric layers and the length of one side thereof are substantially equal to the thickness of the piezoelectric layer and the length of one side of the extensional resonator, respectively, the inter-terminal capacity of the bending resonator 61 will be substantially equal to that of the extensional resonator.

Figure 12A:
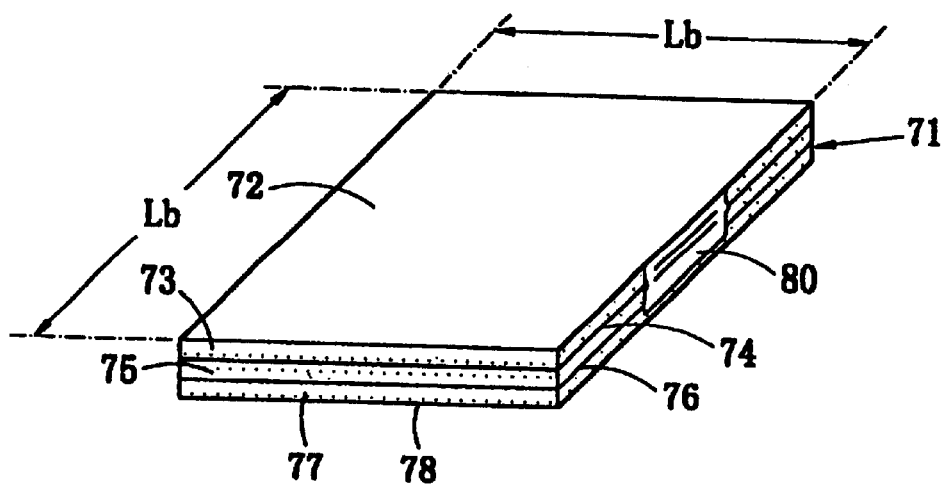
FIG. 12A is a perspective view of the bending vibrator (parallel resonator) used in the ladder filter shown in FIG. 5.
Figure 12B:
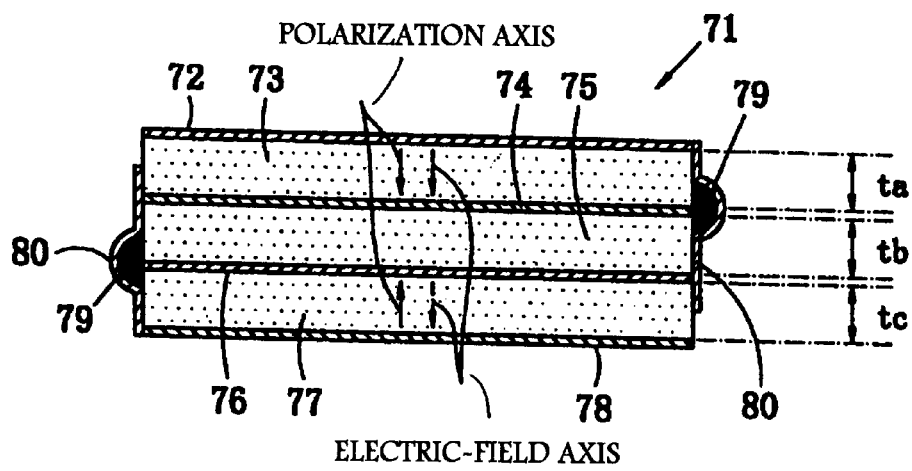
FIG. 12B is a sectional view thereof.
Figure 13A:
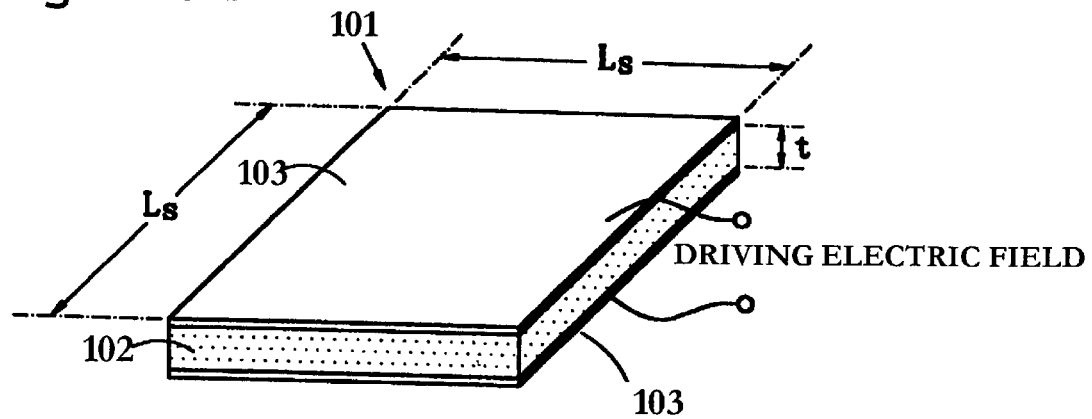
FIG. 13A is a perspective view illustrating the construction of a conventional extensional resonator.
Figure 13B:
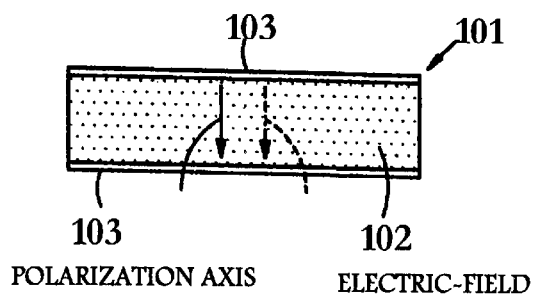
FIG. 13B is a side view illustrating the directions of the polarization axis and the electric-field axis thereof.

Next, the bending resonator 71 that defines a parallel resonator will be described. FIG. 12A is a perspective view of this bending vibrator 71, and FIG. 12B is a sectional view thereof. The bending resonator 71 is constructed by sandwiching two internal electrodes 74 and 76 between three-layered ceramic piezoelectric layers 73, 75, and 77 each having a substantially square shape, and by providing surface electrodes 72 and 78 on the main surfaces on the front and rear side surfaces of the laminated body, respectively, which includes laminated piezoelectric layers 73, 75, and 77 and internal electrodes 74 and 76. The central piezoelectric layer 75 is not polarized, but the piezoelectric layers 73 and 77 on both sides thereof are polarized in the direction that is substantially perpendicular to the main surfaces such that the polarization directions thereof are opposite to each other. As indicated by solid line arrows in FIG. 12B, the polarization axis direction may extend in the outward direction with respect to the central piezoelectric layer 75, or may extend in the inward direction with respect to the central piezoelectric layer 75.

Furthermore, the piezoelectric resonator 71 is provided with connection electrodes 80 on both sides thereof. One of the connection electrodes 80 is electrically connected to the surface electrode 72 and the internal electrode 76 at an interval of one layer, and is insulated from the intermediate internal electrode 74 by an insulating material 79 provided on the side. The other of the connection electrodes 80 is electrically connected to the surface electrode 78 and the internal electrode 74 at an interval of one layer, and is insulated from the intermediate internal electrode 76 by the insulating material 79 provided on the side.

Therefore, once a voltage in the direction indicated by broken line arrows in FIG. 12B is applied across the surface electrodes 72 and 78, the electric field direction and the polarization direction are the same within one piezoelectric layer out of the piezoelectric layers 73 and 77, so that the piezoelectric layer contracts toward the center direction, while, within the other piezoelectric layer, the electric-field direction and the polarization direction are opposite to each other, so that the piezoelectric layer expands toward the outer edge direction. This results in an area bending vibration. The nodes of this bending vibrator 71 also lie on the approximate central portions of all of the sides.

In this bending resonator 71, the product of the length Lb of one side thereof and the resonance frequency fr is substantially constant as expressed by:

$$Lb \times fr = Ab \tag{6}$$

where, the frequency constant Ab is $$Ab \approx 430 \text{ mmkHz}$$

Since the frequency constant Ab of this bending resonator 71 is approximately 0.2 times the frequency constant As of the extensional resonator, the length Lb of one side of the bending resonator 71 is approximately 0.2 times the length Ls of one side of the extensional resonator, with respect to the same resonance frequency fr. When comparing the bending resonator 71 with the extensional resonator, therefore, the length of one side of the bending resonator 71 is not more than approximately ⅕ times the length of one side of the extensional resonator, and the area of the bending resonator 71 is approximately 1/24 times the area of the extensional resonator. Given the same resonance frequency fr, therefore, the dimensions of the resonator are greatly reduced as compared with the dimensions of the extensional resonator by using a bending resonator 71.

In the three-layered bending resonator 71, denoting the length of one side thereof as Lb, the dielectric constant of the piezoelectric layers 73, 75, and 77 as $\epsilon$, and the thickness of each of the piezoelectric layers 73, 75, and 77 as ta, tb, and tc, the inter-terminal capacity thereof Cp is expressed by the following equation.

$$Cp = (\epsilon \times \epsilon_0 \times Lb^2)(1/ta + 1/tb + 1/tc) \tag{7}$$

where, $\epsilon_0$ is a permittivity in a vacuum.

Here, this bending resonator 71 will be compared with the extensional resonator which is substantially equal to the bending resonator 71 in the piezoelectric material (the same $\epsilon$ value), dimensions (Lb=Ls), and the thickness (ta+tb+tc=t). The inter-terminal capacity Cs of the extensional resonator is represented by the above-described equation (3). On the other hand, letting the thicknesses of all of the piezoelectric layers 73, 75, and 77 of the bending resonator 71 be equal (ta=tb=tc=t/3), the inter-terminal capacity Cp thereof is expressed by the following equation (8).

$$\begin{aligned} Cp &= (\varepsilon \times \varepsilon_0 \times Lb^2)(9/t) \\ &= 9Cs \end{aligned} \tag{8}$$

Given the same dimensions and the same thickness, therefore, the bending resonator 71 obtains an inter-terminal capacity of about nine times the terminal capacity of the extensional resonator (or the bending resonator 61). Since the entire thickness of these laminated layers is the same as the extensional resonator or the bending resonator 61 although the thickness of each of the piezoelectric layers 73, 75, and 77 is reduced, these piezoelectric layers are provided with outstanding strength.

Therefore, if the bending resonator 61 is used as a serial resonator in a ladder filter as shown in FIG. 1, and the bending resonator 71 is used as a parallel resonator, the guaranteed attenuation value Att. of the ladder filter 31 will increase by 38.2 dB, as expressed by the following equation (9).

$$\Delta Att. = 2 \times 20 \log (Cb/Cs) = 38.2 \text{ [dB]} \tag{9}$$

By using materials having different dielectric constants $\epsilon$, and by adjusting the thicknesses of the serial resonator and the parallel resonator, the ratio of capacities and the guaranteed attenuation value can be extensively adjusted.

As described above, when comparing the extensional resonator and the bending resonators 61 and 71 under the same resonance frequency fr condition, the areas of the bending resonators 61 and 71 are approximately 1/10 times the area of the extensional resonator ($Lb^2 \approx Ls^2/10$). Such a size-reduction of both of the bending resonators 61 and 71 permits miniaturization of the ladder filter 31.

Further, since the units are connected by the conductive patterns provided on the substrate 32 and by the lid 33, there is no need to provide in the inside thereof spaces for wiring such as wire bonding. This leads to a further miniaturization of the ladder filter.

Moreover, in the ladder filter 31 in accordance with various preferred embodiments of the present invention, units wherein two bending resonator 61 and 71 are stacked, are two-dimensionally arranged, the ladder filter has a very low profile.

Figure 16A:
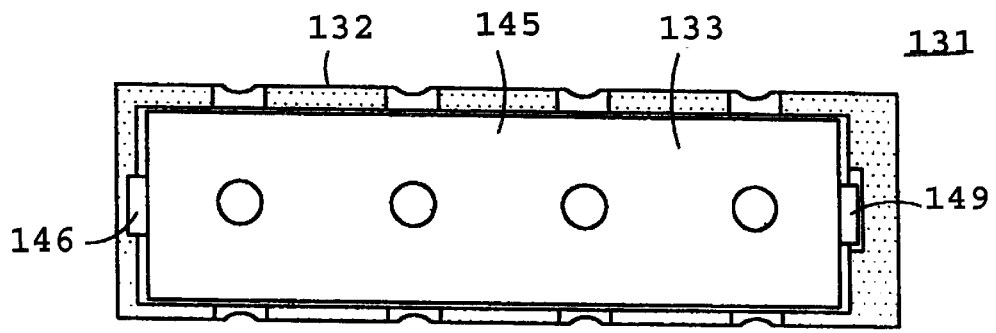
FIG. 16A is a plan view showing the construction of a ladder filter in accordance with another preferred embodiment of the present invention.
Figure 16B:
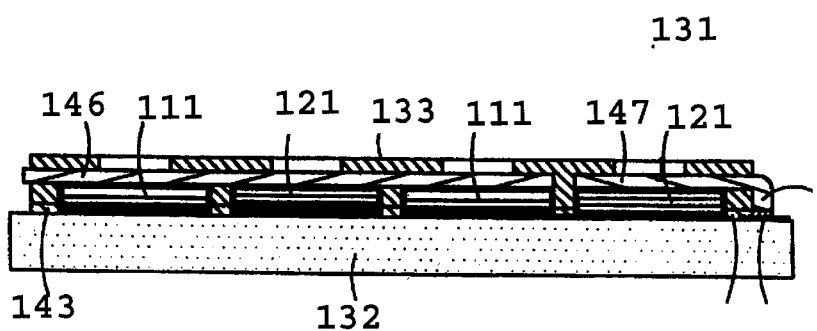
FIG. 16B is a sectional view thereof.
Figure 17:
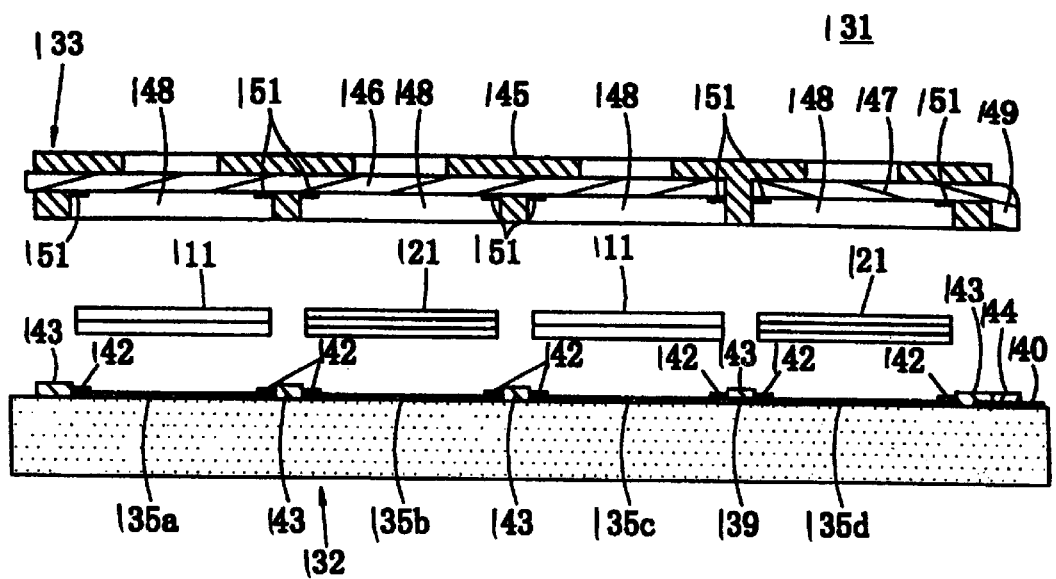
FIG. 17 is a sectional view illustrating the ladder filter shown in FIG. 16 in a disassembled state.

FIG. 16A is a plan view showing the construction of a ladder filter 131 in accordance with a second preferred embodiment of the present invention, and FIG. 16B is a sectional view thereof. FIG. 17 is a sectional view illustrating this ladder filter 131 in a disassembled state. The ladder filter 131 is a two-stage filter, and includes a substrate 132, two sets of piezoelectric resonators utilizing are a bending vibration (bending resonators) 111 and 121, and a lid 133. One set of the bending resonators 111 out of the two sets of the bending resonators 111 and 121 define serial resonators in the ladder filter 131, and the other set of the bending resonators 121 define parallel resonators in the ladder filter 131.

Figure 18A:
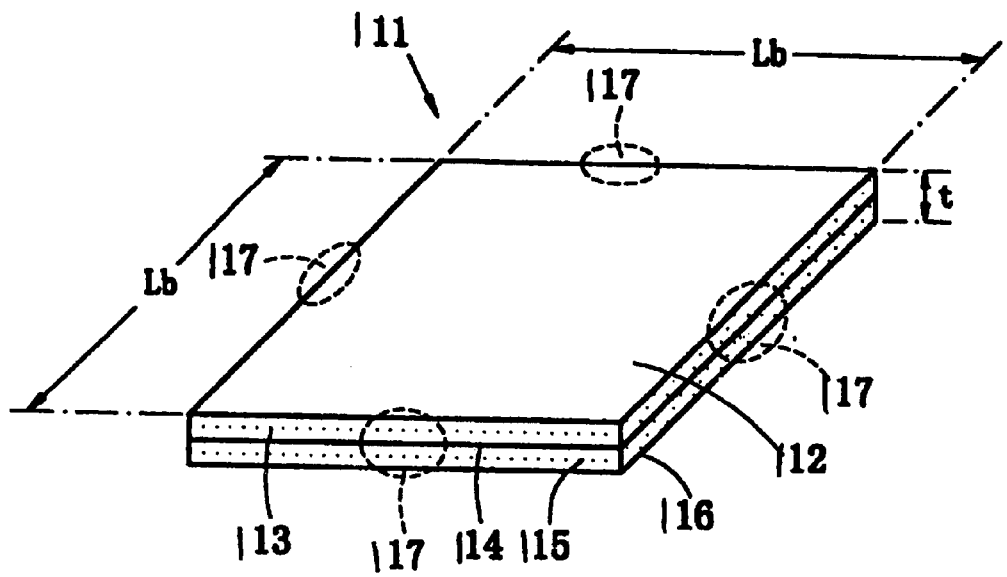
FIG. 18A is a perspective view illustrating the bending vibrator (serial resonator) used in the ladder filter shown in FIG. 16.

First, the bending resonator 111 defining a serial resonator will be described. FIG. 18A is a perspective view illustrating this bending vibrator 111. The bending resonator 111 is used, for example, in the frequency band of about 300 kHz to about 800 kHz. The bending resonator 111 is constructed by sandwiching an internal electrode 114 between two-layered ceramic piezoelectric layers 113 and 115 each having a substantially square shape, and by providing surface electrodes 112 and 116 on both main surfaces on the front and rear sides of the laminated body, respectively, which includes piezoelectric layers 113 and 115 and an internal electrode 114. The piezoelectric layers 113 and 115 on both sides of the internal electrode 114 are polarized in a direction that is substantially to the main surfaces such that the polarization directions thereof are opposite to each other. As indicated by solid line arrows in FIG. 18B, the polarization direction may extend in the outward direction with respect to the internal electrode 114, or may extend in the inward direction with respect to the internal electrode 114.

Figure 18B:
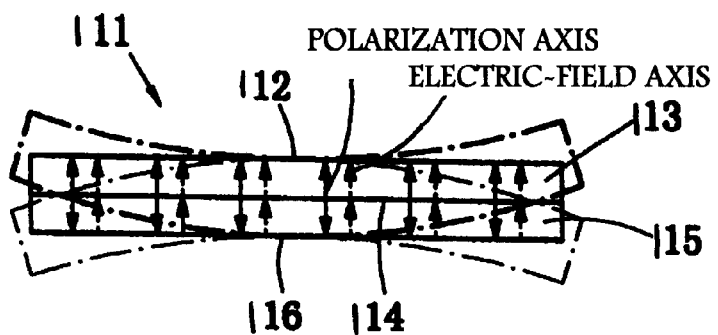
FIG. 18B is a explanatory view illustrating a state of the area bending vibration thereof.

Once a voltage is applied across the surface electrodes 112 and 116, therefore, an electric field is generated in the direction indicated by broken line arrows in FIG. 18B. Within one of the piezoelectric layers, the electric-field direction and the polarization direction are the same, such that the piezoelectric layer contracts toward the center direction, while, within the other of the piezoelectric layers, the electric-field direction and the polarization direction are opposite to each other, such that the piezoelectric layer extends toward the outer edge direction. As a result, when a signal (a high-frequency electric field) is applied between the surface electrodes 112 and 116, the piezoelectric layers 113 and 115 operate in an extensional vibration mode, that is, each expand in the outer edge direction and contract in the center direction. However, the piezoelectric layers 113 and 115 have opposite phases of expansion and contraction, and therefore, as shown in FIG. 18B, the bending resonator 111 is bent and deforms such that both main surfaces thereof are alternately convexed and concaved repeatedly (bending vibration), as a whole. The nodes 117 of this bending vibrator are located at the approximate central portions of all of the sides.

In this bending resonator 111, the product of the length Lb of one side thereof and the resonance frequency fr is substantially constant as expressed by:

$$Lb \times fr = Ab$$

where, the frequency constant Ab is:

$$Ab \approx 430 \text{ mmkHz}$$

Since the frequency constant Ab of this bending resonator 111 is approximately 0.2 times the frequency constant As of the extensional resonator, the length Lb of one side of the bending resonator 111 is approximately 0.2 times the length Ls of one side of the extensional resonator, with respect to the same resonance frequency fr. When comparing the bending resonator 111 with the extensional resonator, therefore, the length of one side of the bending resonator 111 is not more than approximately ⅕ times the length of one side of the extensional resonator, and the area of the bending resonator 111 is approximately 1/24 times the area of the extensional resonator. Given the same resonance frequency fr, therefore, the dimensions of the resonator is greatly reduced as compared to the dimensions of the extensional resonator by using a bending resonator 111.

In the bending resonator 111, denoting the length of one side thereof as Lb, the dielectric constant of the piezoelectric layers as $\epsilon$, and the total thickness of the piezoelectric layers as t, the inter-terminal capacity thereof Cp is expressed by the following equation.

$$Cp = (\epsilon \times \epsilon_0 \times Lb^2)/t$$

where, $\epsilon_0$ is a permittivity in a vacuum. Hence, if the total thickness of the piezoelectric layers and the length of one side thereof are substantially equal to the thickness of the piezoelectric layer and the length of one side of the extensional resonator, respectively, the inter-terminal capacity of the bending resonator 111 will be substantially equal that of the extensional resonator.

Figure 19A:
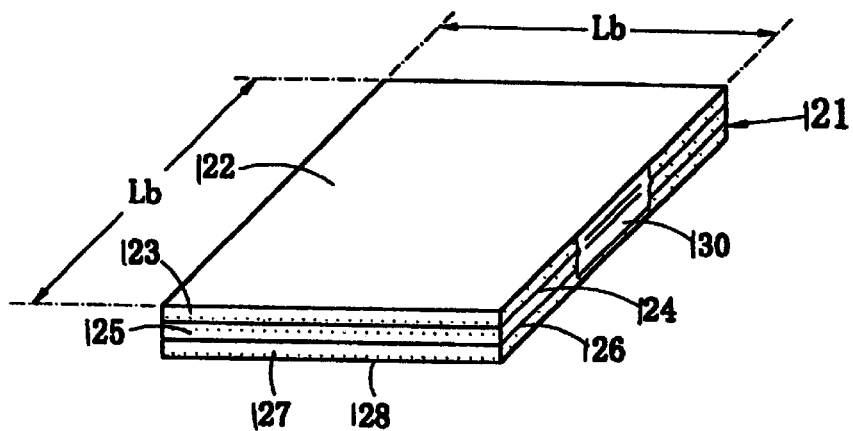
FIG. 19A is a perspective view illustrating the bending vibrator (parallel resonator) used in the ladder filter shown in FIG. 16.

Next, the bending resonator 121 defining a parallel resonator will be described. FIG. 19A is a perspective view of this bending vibrator 121, and FIG. 12B is a sectional view thereof. The bending resonator 121 is constructed by sandwiching two internal electrodes 124 and 126 between three-layered ceramic piezoelectric layers 123, 125, and 127 each having a substantially square shape, and by providing surface electrodes 122 and 128 on the main surfaces on the front and rear sides of the laminated body, respectively, which includes laminated piezoelectric layers 123, 125, and 127 and internal electrodes 124 and 126. The central piezoelectric layer 125 is not polarized, but the piezoelectric layers 123 and 127 on both sides thereof are polarized in the direction that is substantially perpendicular to the main surfaces such that the polarization directions thereof are opposite to each other. As indicated by solid line arrows in FIG. 19B, the polarization axis direction may extend in the outward direction with respect to the central piezoelectric layer 125, or may extend in the inward direction with respect to the central piezoelectric layer 125.

Furthermore, the piezoelectric resonator 121 is provided with connection electrodes 130 on both sides thereof. One of the connection electrodes 130 is electrically connected to the surface electrode 122 and the internal electrode 126 at an interval of one layer, and is insulated from the intermediate internal electrode 124 by an insulating material 129 provided on the side. The other of the connection electrodes 130 is electrically connected to the surface electrode 128 and the internal electrode 124 at an interval of one layer, and is insulated from the intermediate internal electrode 126 by the insulating material 129 provided on the side.

Figure 19B:
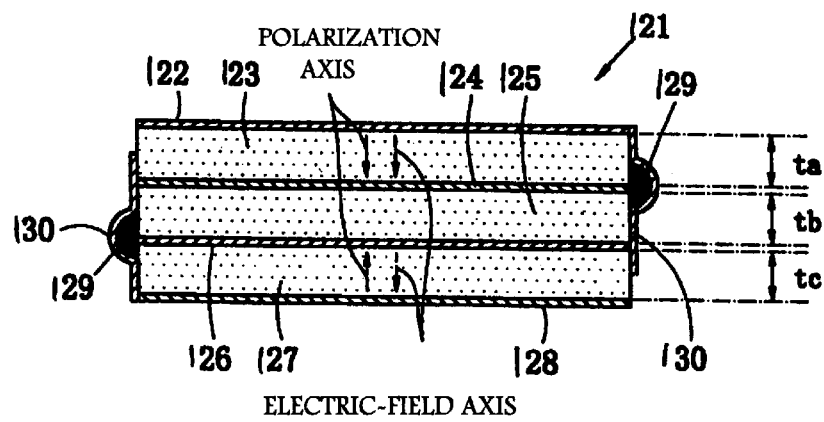
FIG. 19B is a sectional view thereof.

Once a voltage is applied across the surface electrodes 122 and 128, therefore, an electric field is generated in the direction indicated by broken line arrows in FIG. 19B. Within one piezoelectric layer out of the piezoelectric layers 123 and 127, the electric-field direction and the polarization direction are the same, such that the piezoelectric layer contracts toward the center direction, while, within the other piezoelectric layer, the electric-field direction and the polarization direction are opposite to each other, such that the piezoelectric layer expands toward the outer edge direction. This results in an are a bending vibration. The nodes of this bending vibrator 121 also are located at approximately central portions of all of the sides.

In this bending resonator 121 also, the product of the length Lb of one side thereof and resonance frequency fr is substantially constant as expressed by:

$$Lb \times fr = Ab$$

where, the frequency constant Ab is $$Ab \approx 430 \text{ mmkHz}$$

Since the frequency constant Ab of this bending resonator 121 is approximately 0.2 times the frequency constant As of the extensional resonator, the length Lb of one side of the bending resonator 121 is approximately 0.2 times the length Ls of one side of the extensional resonator, with respect to the same resonance frequency fr. When comparing the bending resonator 121 with the extensional resonator, therefore, the length of one side of the bending resonator 121 is not more than approximately ⅕ times the length of one side of the extensional resonator, and the area of the bending resonator 121 is approximately 1/24 times the area of the extensional resonator. Given the same resonance frequency fr, therefore, the dimensions of the resonator can be made much smaller than that of the extensional resonator by using a bending resonator 121.

In the three-layered bending resonator 121, denoting the length of one side thereof as Lb, the dielectric constant of the piezoelectric layers as $\epsilon$, and the thickness of each of the piezoelectric layers 123, 125, and 127 as ta, tb, and tc, the inter-terminal capacity thereof Cp is expressed by the following equation.

$$Cp=(\epsilon \times \epsilon_0 \times Lb^2)(1/ta+1/tb+1/tc)$$

where, $\epsilon_0$ is a permittivity in a vacuum.

Here, this bending resonator 121 will be compared with the extensional resonator which is substantially equal to the bending resonator 121 in the piezoelectric material (the same $\epsilon$ value), dimensions (Lb=Ls), and the thickness (ta+tb+tc=t). The inter-terminal capacity Cs of the extensional resonator 121 is represented by the above-described equation (3). On the other hand, setting the thicknesses all of the piezoelectric layers 123, 125, and 127 of the bending resonator 121 to be equal (ta=tb=tc=t/3), the inter-terminal capacity Cp thereof is expressed by the following equation.

$$Cp = (\varepsilon \times \varepsilon_0 \times Lb^2)(9/t)$$
$$= 9Cs$$

Given the same dimensions and the same thickness, therefore, the bending resonator 121 has an inter-terminal capacity that is about nine times greater than that of the extensional resonator (or the bending resonator 111). Since the entire thickness of these laminated layers is substantially the same as the extensional resonator or the bending resonator 111 although the thickness of each of the piezoelectric layers 123, 125, and 127 is reduced, these piezoelectric layers provide outstanding strength.

Figure 14:
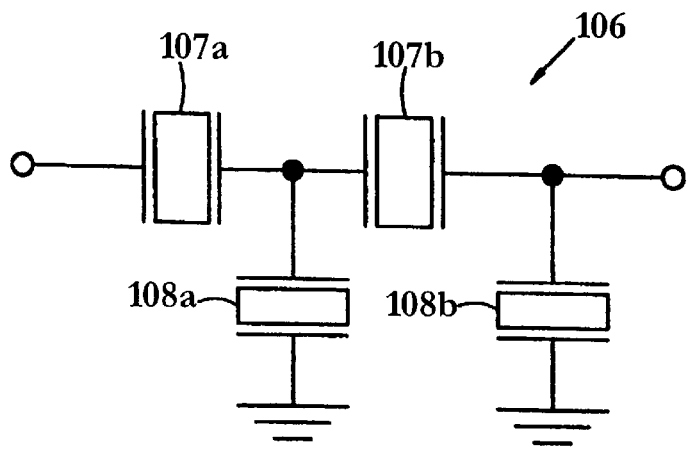
FIG. 14 is a diagram illustrating the circuit configuration of a ladder filter.
Figure 15:
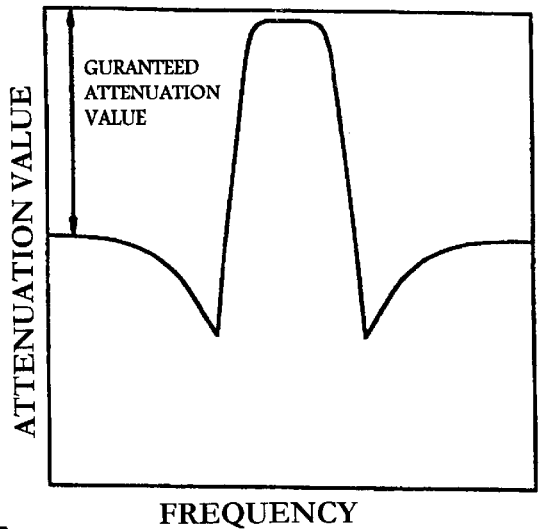
FIG. 15 is a graph illustrating the characteristics of the ladder filter shown in FIG. 14.

Therefore, if the bending resonator 111 is used as a serial resonator included in a ladder filter as shown in FIG. 14, and the bending resonator 121 is used as a parallel resonator, the guaranteed attenuation value Att. of the ladder filter 131 will increase by 38.2 dB, as expressed by the following equation.

$$\Delta Att.=2 \times 20 \log (Cb/Cs)=38.2 \text{ [dB]}$$

By using materials having different dielectric constants $\epsilon$, and by adjusting the thicknesses of the serial resonator and the parallel resonator, the ratio of capacities and the guaranteed attenuation value can be extensively adjusted.

As described above, when comparing the extensional resonator and the bending resonators 111 and 121 under the same resonance frequency fr condition, the area of the bending resonators 111 and 121 are approximately 1/10 times the area of the extensional resonator ($Lb^2 \approx Ls^2/10$). Such a size-reduction of both of the bending resonators 111 and 121 enables the miniaturization of the ladder filter 131.

Figure 20A:
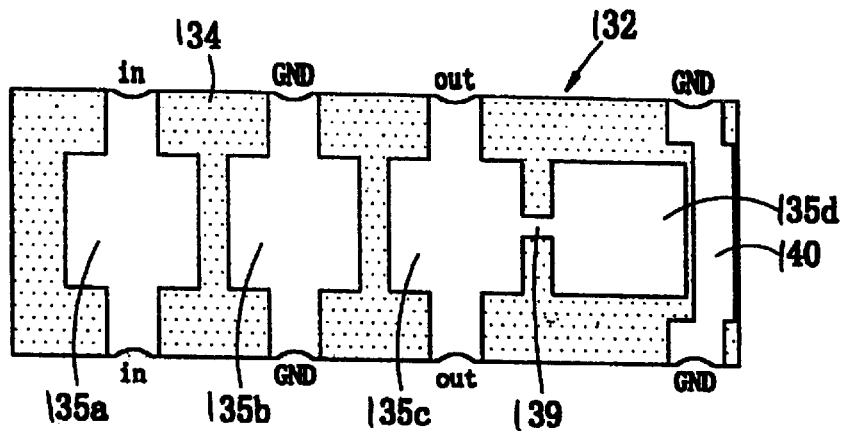
FIG. 20A is a plan view illustrating the substrate used for the ladder filter shown in FIG. 16.
Figure 20B:
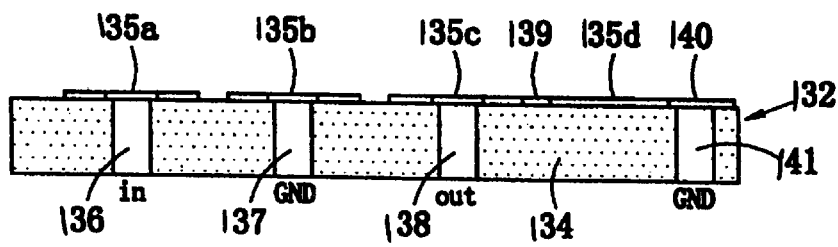
FIG. 20B is a side view thereof.

Next, the construction of the substrate 132 will be described with reference to FIGS. 20A and 20B. This substrate 132 is constructed by providing conductive patterns on the top surface and both sides of a ceramic plate 134, and has four resonator-mounting pad portions 135a, 135b, 135c, and 135d on the top surface thereof. Input terminals 136 extend from a first pad portion 135a, ground terminals 137 extend from a second pad portion 135b, and output terminals 138 extend from a third pad portion 135c. A third pad portion 135c and a fourth pad portion 135d are conductive with each other by a connection line 139, and also an external electrode 141 for grounding extends to both sides from a belt-shaped connection pad 140 provided at a position adjacent to the fourth pad portion 135d.

Figure 21:
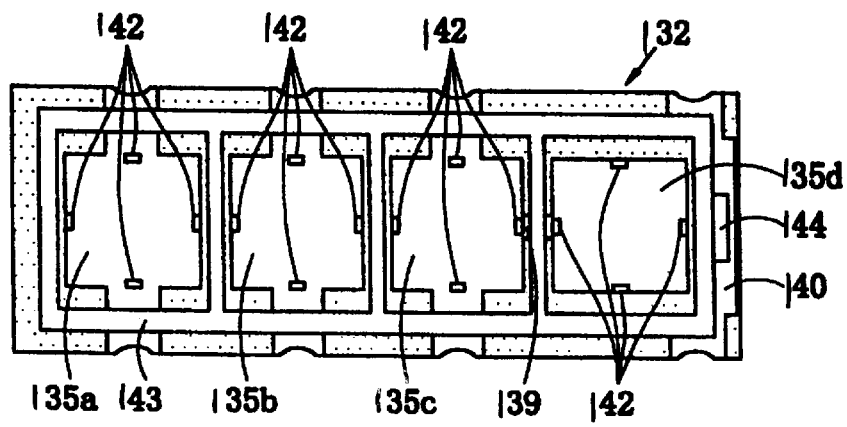
FIG. 21 is a plan view showing the substrate on which conductive pillows are provided and on which a solder resist ink and an insulating adhesive are applied.

During assembly, as shown in FIG. 21, a conductive pillow 142 is provided at each of the approximate central portions of all of the sides of all of the pad portions 135a, 135b, 135c, and 135d by applying and setting a conductive adhesive. On the top surface of the substrate 132, an insulating adhesive 143 is applied such that it surrounds all of the pad portions 135a, 135b, 135c, and 135d, and a conductive adhesive 144 is applied to the approximate central portion of the connection pad 140.

Then, as illustrated in FIGS. 16 and 17, when the bending resonators 111 are placed on the pad portions 135a and 135c, the conductive pillows 142 of the pad portions 135a and 135c support the bending resonators 111 by abutting against the bottom surfaces of the nodes 117 of the bending resonators 111. Thereby, the bending resonators 111 are supported only by the nodes 117 such that vibrations are not substantially damped, and vibrational spaces are provided between the bending resonators 111 and the pad portions 135a and 135c. In addition, the surface electrodes 116 of the bending resonators 111 are conductive to the pad portions 135a and 135c via the conductive pillows 142. As a result, the surface electrode 116 on the bottom surface of one of the bending resonators 111 is conductive with the input terminal 136, and the surface electrode 116 on the bottom surface of the other of the bending resonators 111 is conductive with the output terminal 138.

Likewise, when the bending resonators 121 are placed on the pad portions 135b and 135d, the conductive pillows 142 of the pad portions 135b and 135d support the bending resonators 121 by abutting against the bottom surfaces of the nodes of the bending resonators 121. The bending resonators 121 are supported only by the nodes such that vibrations are resistant to damping, and vibrational spaces are provided between the bending resonators 121 and the pad portions 135b and 135d. In addition, the surface electrodes 128 of the bending resonators 121 are conductive with the pad portions 135b and 135d via the conductive pillows 142. As a result, the surface electrode 128 on the bottom surface of one of the bending resonators 121 is conductive with the ground terminal 137, and the surface electrode 128 on the bottom surface of the other of the bending resonators 121 is conductive with the output terminal 138 via the connection line 139.

Figure 22A:
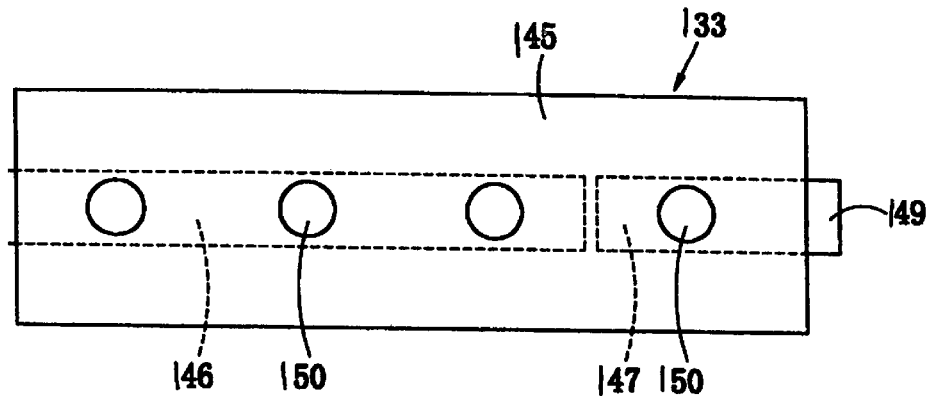
FIG. 22A is a plan view illustrating a lid.

Next, the construction of the lid 133 will be described with reference to FIGS. 22A, 20B, and 22C. This lid 133 is preferably formed by insert-molding two metallic plates 146 and 147 in a resin portion 145. On the bottom surface of the lid 133, four recesses 148 are provided at positions corresponding to the positions where all of the bending resonators 111, 121, 111, and 121 are disposed, and the metallic plates 146 and 147 are exposed in the recesses 148. One metallic plate 146 is inserted across three recesses 148, and the other metallic plate 147 is inserted in the remaining one recess 148. The end of the other metallic plate 147 protrudes out of the resin portion 145, and is bent downward. The tip of the bent portion 149 reaches the horizontal plane including the bottom surface of the lid 133. Holes 150 in the top surface of the resin portion 145 are the remains of supporting pins which support the metallic plates 146 and 147 when the metallic plates 146 and 147 are insert-molded.

Figure 22B:
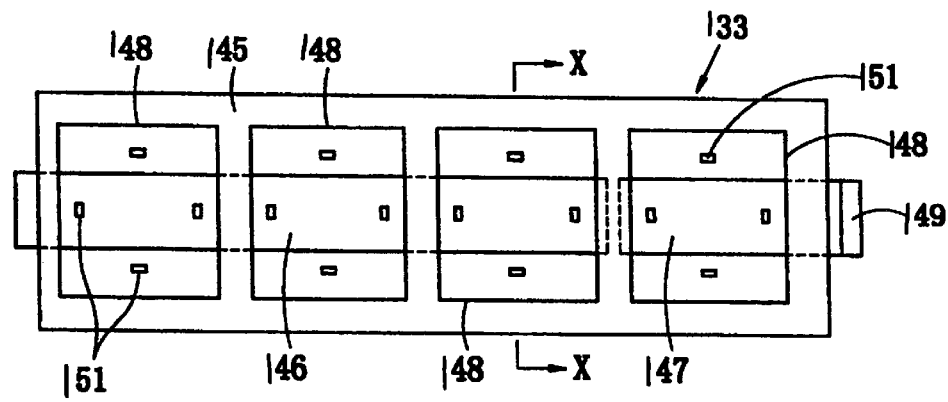
FIG. 22B is a bottom view thereof.
Figure 22C:
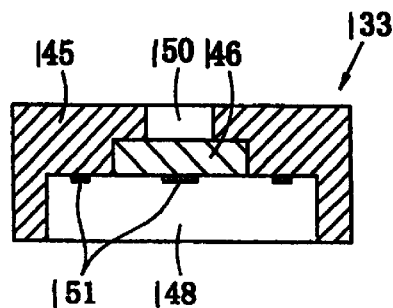
FIG. 22C is a sectional view taken along the X-X line in FIG. 22B.

As illustrated in FIG. 22B, in each of the recesses 148 of the lid 133, conductive pillows 151 are provided in the approximate central portions of all of the sides by applying and setting a conductive adhesive. Then, when the lid 133 is provided on the substrate 132 on which the resonators 111 and 121 is mounted, the conductive pillows 151 each abut against the top surfaces of the nodes of the resonators 111 and 121, and the bottom surface of the lid 133 is adhered on the top surface of the substrate 132 by an adhesive 143 applied on the substrate 132. Simultaneously, the tip of the bent portion 149 of the metallic plate 147 is adhered to the connection pad 140 with a conductive adhesive 144, and is made conductive to the ground terminal 141. As a result, bending resonators 111 and 121 are each supported by the conductive pillows 151 on the lid side and the conductive pillows 142 of the substrate side such that the nodes thereof are sandwiched, and vibrational spaces are provided between the top surfaces of the bending resonators 111 and 121 and the lid 133. The surface electrodes 112 of the top surface side of the two bending resonators 111 and the surface electrode 122 of the top surface side of one bending resonator 121 are made conductive with one another via the metallic plate 46, and the surface electrode 122 on the top surface side of the other bending resonator 121 is electrically connected to the ground terminal 141 via the metallic plate 147 and the conductive adhesive 144.

The ladder filter 131 in accordance with various preferred embodiments of the present invention is constructed by ladder-connecting four bending resonators 111 and 121 as described above. Since these bending resonators 111 and 121 are two-dimensionally arranged on the substrate 132, the ladder filter 131 has a very low profile, and use of the bending resonators 111 and 121 permits further miniaturization of the ladder filter 131. Also, bending resonators 111 and 121, each having more internal electrodes and larger inter-terminal capacities, are used as parallel resonators, while bending resonators each, having fewer internal electrodes and smaller inter-terminal capacities, are used as serial resonators, the guaranteed attenuation value Att. of the ladder filter 131 is greatly increased.

Figure 23A:
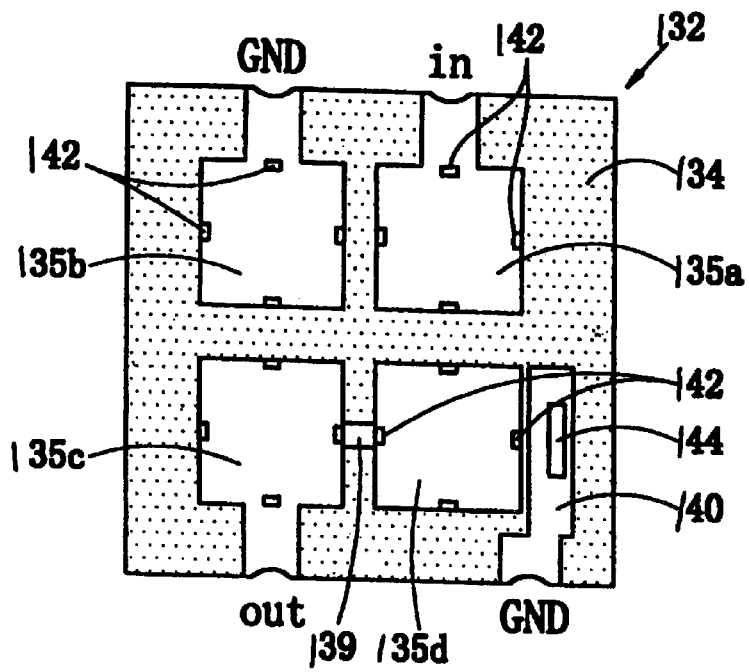
FIGS. 23A and 23B are plan views of the substrate and lid, respectively, used in the ladder filter in accordance with another preferred embodiment of the present invention.
Figure 23B:
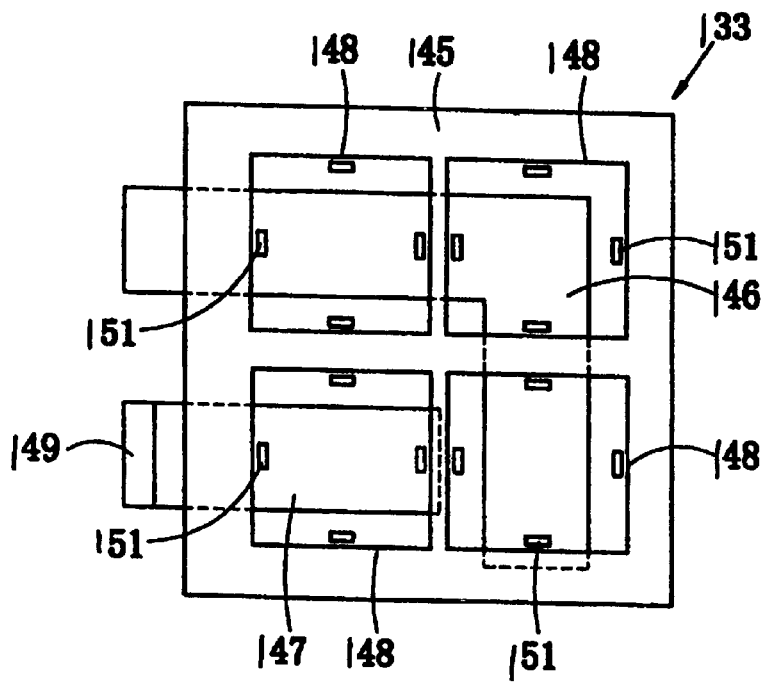

In the above-described preferred embodiments, four bending resonators 111 and 121 are preferably arranged in line, however the bending resonators 111 and 121 can also have different arrangements. For example, in the substrate 132 and the lid 133 shown in FIGS. 23A and 23B, the pad portions 135a, 135b, 135c, and 135d, and the recesses 148 are arranged in a grid pattern. By mounting the bending resonators 111 and 121 between the substrate 132 and lid 133, a low profile and small-sized, substantially square ladder filter is produced.

The ladder filter in accordance with the present invention is not limited to a four-element type. Multi-stage types including more elements may be produced in accordance with the present invention. Furthermore, the number of internal electrodes of a bending resonator is not restricted to one layer or two layers. Internal electrodes constituted of any suitable number of layers may be used.

As described hereinabove, in the ladder filter in accordance with the first preferred embodiment of the present invention, the ladder filter can be easily redesigned to increase the number of the stages of filters. A substantially thin and smaller ladder filter is produced.

Furthermore, in the ladder filter in accordance with the first preferred embodiment of the present invention, the inter-terminal capacity of the parallel resonator is greater than that of the serial resonator, and thereby the guaranteed attenuation value of the ladder filter is greatly increased to improve filter characteristics thereof, without enlarging the parallel resonator or substantially thinning the resonator.

Moreover, in the ladder filter in accordance with the first preferred embodiment of the present invention, the wiring resistance is greatly reduced by increasing the line widths of patterns, while greatly reducing the size of the ladder filter. Also, since substantially the entire surface of the lid has an electric conductivity, and is conductive with the other side surface electrodes of the parallel resonators, the other side surface electrodes having ground potentials, the lid has a electromagnetic shielding effect, which produces a ladder filter which is highly immune to noise.

In the ladder filter in accordance with preferred embodiments of the present invention, a low profile and substantially smaller ladder filter is produced at a greatly reduced cost.

Furthermore, in the ladder filter in accordance with the second preferred embodiment of the present invention, since the piezoelectric resonator is insulated from the substrate and the lid by the conductive protrusions, the surface electrodes of the piezoelectric resonators can be led out to the substrate side or the lid side, and further vibrational spaces can be provided over both surface of the piezoelectric resonators.

Moreover, in the ladder filter in accordance with the second preferred embodiment of the present invention, the inter-terminal capacity of the parallel resonator is larger than that of the serial resonator, and thereby, the guaranteed attenuation value of the ladder filter is greatly increased to improve filter characteristics thereof, without substantially enlarging the parallel resonator or substantially thinning the resonator.

Additionally, in the ladder filter in accordance with the second preferred embodiment of the present invention, since the lid is formed by insert-molding metallic plates in the resin molded portion thereof, the insulating portions and the conductive portions thereof are each easily produced at a greatly reduced cost.

Finally, in the ladder filter in accordance with the second preferred embodiment of the present invention, since the metallic plates are in contact with the conductive patterns on the substrate via the portion exposed to the outside of the lid, the connection between the metallic plates (conductive portions) of the lid and the conductive patterns on the substrate are easily checked by an external inspection.

It should be understood that the foregoing description is only illustrative of the present invention. Various alternatives and modifications can be devised by those skilled in the art without departing from the invention. Accordingly, the present invention is intended to embrace all such alternatives, modifications and variations which fall within the scope of the appended claims.

What is claimed is:

1. A ladder filter comprising:

a substrate;

a plurality of conductive members;

a plurality of sets of units each of which includes a serial resonator utilizing area bending vibration and having one side surface electrode provided thereon, and a parallel resonator utilizing area bending vibration and having one side surface electrode provided thereon stacked on said serial resonator with at least one of said plurality of conductive members sandwiched between said one side surface electrode of said serial resonator and said one side surface electrode of said parallel resonator;

conductive patterns provided on said substrate; and a conductive lid for covering said plurality of sets of units; wherein the plurality of sets of said units are two-dimensionally arranged on said substrate;

said lid is provided on said substrate so as to cover said plurality of sets of units;

another side surface electrode of said serial resonator in each of said plurality of sets of units at a second stage and at stages thereafter is conductive with said conductive member at the preceding stage by said conductive patterns and said lid;

another side surface electrode of said parallel resonators of all of the units are conductive with one another; and said side surface electrodes of said serial resonators and said parallel resonators are disposed substantially parallel to one another.

2. A ladder filter as claimed in claim 1, wherein said serial resonators and said parallel resonators have a different number of internal electrodes from one another and the parallel resonator includes more internal electrodes than the serial resonator.

3. A ladder filter as claimed in claim 1, wherein said the entire surface of said lid is electrically conductive such that the other side surface electrodes of said parallel resonators of all of said plurality of sets of units are conductive with one another by said lid.

4. A ladder filter as claimed in claim 1, wherein said serial resonators and said parallel resonators include conductive protrusions provided on top surfaces and in the vicinity of nodes of said serial resonators and said parallel resonators.

5. A ladder filter as claimed in claim 4, further comprising at least one metallic terminal plate in contact with said conductive protrusions.

6. A ladder filter as claimed in claim 1, wherein said serial resonators and said parallel resonators include conductive protrusions provided on bottom surfaces and in the vicinity of nodes of said serial resonators and said parallel resonators.

7. A ladder filter as claimed in claim 6, further comprising at least one metallic terminal plate in contact with said conductive protrusions.

8. A ladder filter as claimed in claim 1, wherein said substrate include an input terminal, a ground terminal, and an output terminal provided on both sides thereof.

9. A ladder filter as claimed in claim 8, wherein said input terminals on both sides of said substrate are interconnected provided on a rear surface of said substrate.

10. A ladder filter as claimed in claim 8, wherein said ground terminals on both sides of said substrate are interconnected on a rear surface of said substrate.

11. A ladder filter as claimed in claim 8, wherein said output terminals on both sides of said substrate are interconnected on a rear surface of said substrate.

12. A ladder filter comprising:

a substrate;

a plurality of piezoelectric resonators utilizing area bending vibration;

a lid for covering said plurality of piezoelectric resonators having an inner surface and an outer surface;

a plurality of conductive patterns provided on said substrate; and a plurality of conductive members provided on said inner surface of said lid; wherein the plurality of said piezoelectric resonators are two-dimensionally arranged on said substrate;

said lid is mounted on said substrate to cover said plurality of said piezoelectric resonators, such that said conductive members are in direct contact with at least one of the plurality of piezoelectric resonators; and the plurality of said piezoelectric resonators are ladder-connected by said conductive patterns and said conductive members.

13. A ladder filter as claimed in claim 12, wherein said substrate includes conductive protrusions on a top surface thereof, and said piezoelectric resonators include nodes provided thereon.

14. A ladder filter as claimed in claim 13, wherein the nodes of said piezoelectric resonators are positioned on the conductive protrusions disposed on the top surface of said substrate such that said piezoelectric resonators are supported in a state isolated from said substrate, and said conductive patterns and the electrodes of said piezoelectric resonators are conductive with one another via said conductive protrusions.

15. A ladder filter as claimed in claim 13, wherein said conductive members disposed on the inner surface of said lid are abutted against said nodes of said piezoelectric resonators such that said lid is isolated from said piezoelectric resonators, and said conductive members and the electrodes of said piezoelectric resonators are conductive with one another via said conductive members.

16. A ladder filter as claimed in claim 12, wherein the plurality of said piezoelectric resonators utilizing are a bending vibration are defined by resonators having different numbers of internal electrodes from one another.

17. A ladder filter as claimed in claim 16, wherein the one of the piezoelectric resonators having more internal electrode is a parallel resonator, while the resonator having fewer internal electrodes is a serial resonator.

18. A ladder filter as claimed in claim 12, wherein said lid is made of a insert-molded metallic plate provided in a resin molded portion.

19. A ladder filter as claimed in claim 17, wherein the portions of each of said metallic plates, said portions being exposed to the outside of said lid, are contacted with said conductive patterns on said substrate.

* * * * *